(12) United States Patent
Min et al.

(10) Patent No.: US 10,056,568 B2
(45) Date of Patent: Aug. 21, 2018

(54) DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: Kyoungil Min, Hwaseong-si (KR); Taehyun Sung, Seoul (KR); Hyungu Lee, Asan-si (KR); Junshik Park, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/409,319

(22) Filed: Jan. 18, 2017

(65) Prior Publication Data

US 2017/0358762 A1    Dec. 14, 2017

(30) Foreign Application Priority Data

Jun. 10, 2016    (KR) ........................ 10-2016-0072734

(51) Int. Cl.
*H01L 51/00* (2006.01)
*H01L 51/52* (2006.01)
*H01L 27/32* (2006.01)

(52) U.S. Cl.
CPC ...... *H01L 51/0097* (2013.01); *H01L 51/0001* (2013.01); *H01L 51/5237* (2013.01);
(Continued)

(58) Field of Classification Search
None
See application file for complete search history.

(56) References Cited

U.S. PATENT DOCUMENTS 9,324,959 B2 * 4/2016 Namkung ........... H01L 51/0097
2012/0312481 A1   12/2012 Kang et al.
(Continued)

FOREIGN PATENT DOCUMENTS

EP           2908342 A1     8/2015
KR    10-2011-0111608       10/2011
(Continued)

OTHER PUBLICATIONS

EPO Extended Search Report dated Oct. 9, 2017, for corresponding European Patent Application No. 17167641.4 (7 pages).

*Primary Examiner* — Joseph Schoenholtz
(74) *Attorney, Agent, or Firm* — Lewis Roca Rothgerber Christie LLP

(57) ABSTRACT

A display device and a method of manufacturing a display device are provided. A manufacturing method of a display device includes: forming a display module including a first area defined therein, the display module including a display panel including a lower surface and an upper surface opposite the lower surface, a first film under the lower surface of the display panel, a second film on the upper surface of the display panel, and an adhesive layer between the lower surface of the display panel and the first film; and irradiating a laser beam in an upper direction extending from the lower surface of the display panel to the upper surface of the display panel to cut the first film and the adhesive layer along an edge of the first area, the laser beam provided to the display panel having a laser power equal to or less than about 1 W.

28 Claims, 21 Drawing Sheets

(52) U.S. Cl.
CPC ...... *H01L 51/5281* (2013.01); *H01L 27/3244* (2013.01); *H01L 2227/323* (2013.01); *H01L 2251/5338* (2013.01); *H01L 2251/566* (2013.01)

(56) References Cited

U.S. PATENT DOCUMENTS

| | | |
|---|---|---|
| 2014/0130339 A1 | 5/2014 | Shin |
| 2014/0134763 A1 | 5/2014 | Park et al. |
| 2014/0147577 A1* | 5/2014 | Lee .................. H01L 51/56 427/8 |
| 2015/0014644 A1* | 1/2015 | Namkung ........... H01L 51/0097 257/40 |
| 2015/0227172 A1* | 8/2015 | Namkung ............. G06F 1/1652 345/173 |
| 2015/0263300 A1 | 9/2015 | Namkung et al. |
| 2016/0107425 A1* | 4/2016 | Forier .................... B32B 27/08 428/354 |

FOREIGN PATENT DOCUMENTS

| | | |
|---|---|---|
| KR | 10-2012-0137868 | 12/2012 |
| KR | 10-2014-0033675 | 3/2014 |
| KR | 10-2014-0062666 | 5/2014 |
| KR | 10-2015-0094989 | 8/2015 |

\* cited by examiner

FIG. 2
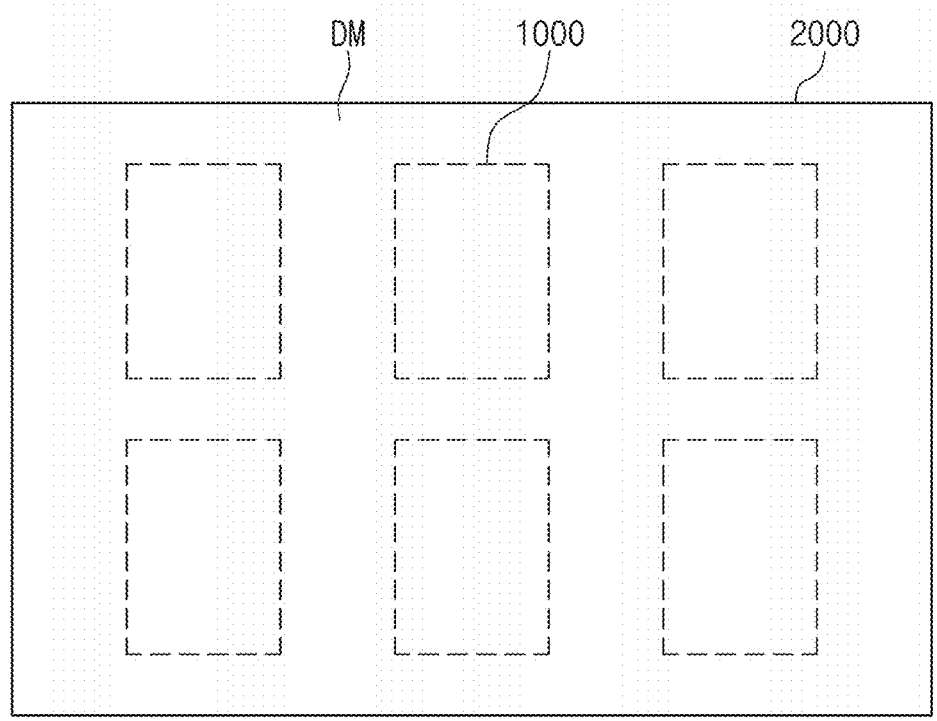
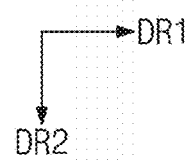

FIG. 4
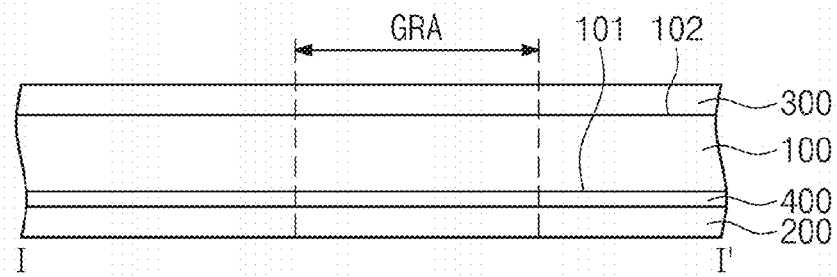
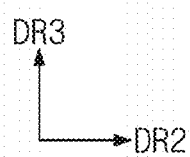
FIG. 5
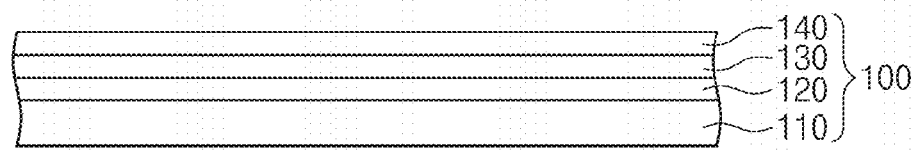
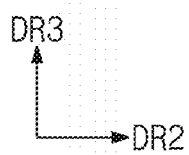

DISPLAY DEVICE AND METHOD OF MANUFACTURING THE SAME

CROSS-REFERENCE TO RELATED APPLICATION

This patent application claims priority to and the benefit of Korean Patent Application No. 10-2016-0072734, filed on Jun. 10, 2016 in the Korean Intellectual Property Office, the entire content of which is hereby incorporated by reference.

BACKGROUND

1. Field

The present disclosure relates to a display device and a method of manufacturing the same. More particularly, the present disclosure relates to an organic light emitting display device and a method of manufacturing the organic light emitting display device.

2. Description of the Related Art

An organic light emitting display device includes a plurality of pixels. Each pixel includes an organic light emitting diode and a circuit part controlling the organic light emitting diode. The circuit part includes at least a control transistor, a driving transistor, and a storage capacitor.

The organic light emitting diode includes an anode, a cathode, and an organic light emitting layer disposed between the anode and the cathode. The organic light emitting diode emits a light when a voltage greater than a threshold voltage of the organic light emitting layer is applied between the anode and the cathode.

SUMMARY

According to an aspect, the present disclosure provides a display device including a display module easily bent in a bending area and having a small radius of curvature by providing a groove overlapped with the bending area in a first film and an adhesive layer.

According to another aspect, the present disclosure provides a method of manufacturing a display device, in which a first film and an adhesive layer may be selectively removed without damaging a base substrate.

According to one or more embodiments of the inventive concept, a method of manufacturing a display device includes forming a display module including a first area defined therein, the display module including a display panel including a lower surface and an upper surface opposite the lower surface, a first film under the lower surface of the display panel, a second film on the upper surface of the display panel, and an adhesive layer between the lower surface of the display panel and the first film and irradiating a laser beam in an upper direction extending from the lower surface of the display panel to the upper surface of the display panel to cut the first film and the adhesive layer along at least one edge of the first area.

In an embodiment, the laser beam provided to the display panel in the cutting of the first film and the adhesive layer has a laser power equal to or less than about 1 W.

In an embodiment, the laser beam is a $CO_2$ laser beam or an UV laser beam.

In an embodiment, the $CO_2$ laser beam has a wavelength of from about 9.1 µm to about 10.7 µm, or the UV laser beam has a wavelength equal to or smaller than about 360 nm.

In an embodiment, the first area crosses the display module in a first direction when viewed in a plan view, and irradiating the laser beam to cut the first film and the adhesive layer includes irradiating the laser beam to a first edge of the at least one edge of the first area extending in the first direction and irradiating the laser beam to a second edge of the at least one edge of the first area extending in the first direction and spaced apart from the first edge of the first area.

In an embodiment, the method further includes bending the display module with respect to a reference axis defined in the first area and extending in the first direction.

In an embodiment, the method further includes irradiating another laser beam to the first area between the first edge and the second edge to cut the first film and the adhesive layer.

In an embodiment, a shape of the lower surface of the display panel is not deformed in the irradiating the laser beam to cut the first film and the adhesive layer.

In an embodiment, the display panel includes a base substrate defining the lower surface and including polyimide. In an embodiment, the first film includes polyethylene terephthalate.

In an embodiment, a first portion of a lower surface of a base substrate of the display panel is exposed by the irradiating the laser beam to cut the first film and the adhesive layer, and the first portion is flat by the irradiating the laser beam.

In an embodiment, the method further includes removing a portion of the first film and a portion of the adhesive layer which are in the first area.

According to one or more embodiments of the inventive concept, a display device includes a display panel, a first film, a second film, and an adhesive layer. The display panel includes a lower surface and an upper surface opposite the lower surface. The first film is under the lower surface of the display panel and includes a film groove defined therein. The second film is on the upper surface of the display panel. The adhesive layer is between the lower surface of the display panel and the first film and includes an adhesive groove defined therein to overlap with the first area.

In an embodiment, the display panel includes a base substrate providing the lower surface and including polyimide.

In an embodiment, a first portion of the base substrate exposed by the film groove and the adhesive groove and a second portion of the base substrate overlapped with the first film and the adhesive layer have a difference of crystallization degree of about 5%.

In an embodiment, the second portion has a crystallization degree greater than a crystallization degree of the first portion.

In an embodiment, the first portion of the base substrate is connected to an inner surface of the adhesive groove.

In an embodiment, a crystallization degree of the first portion is smaller by about 5% than a crystallization degree of a third portion exposed by the film groove and the adhesive groove and spaced apart from the second portion by the first portion.

In an embodiment, the second portion has a same crystallization degree as the third portion.

In an embodiment, a lower surface of the third portion has a surface roughness greater than a surface roughness of a lower surface of the first portion.

In an embodiment, an angle between the second portion of the base substrate and each of an inner surface of the first film providing the film groove and an inner surface of the adhesive layer providing the adhesive groove is an acute angle.

In an embodiment, the display device further includes a burr on a lower surface of the first film adjacent to the film groove.

In an embodiment, the display panel includes a display area to display an image and a non-display area adjacent to the display area, and the film groove and the adhesive groove are in the non-display area.

In an embodiment, the display panel includes a display area to display an image and a non-display area adjacent to the display area, and the film groove and the adhesive groove cross the display area when viewed in a plan view.

In an embodiment, the film groove and the groove cross the display panel in a first direction, and the display device is bent with respect to a reference axis defined to overlap with the film groove and the adhesive groove and extending in the first direction.

In an embodiment, the first film comprises polyethylene terephthalate (PET). The second film includes a polarizing plate.

According to one or more embodiments of the inventive concept, a display device includes a display panel, a first film, a second film, and an adhesive layer. The display panel includes a first area defined therein and includes a lower surface and an upper surface opposite the lower surface. The first film is under the lower surface of the display panel. The second film is on the upper surface of the display panel. The adhesive layer is between the lower surface of the display panel and the first film. The display panel includes a base substrate defining the lower surface of the display panel, a plurality of grooves is defined in the first film and the adhesive layer in the first area to expose the base substrate, and a first portion of the first film and a first portion of the adhesive layer are separated from a second portion of the first film and a second portion of the adhesive layer by a groove of the plurality of grooves in the first area.

In an embodiment, the base substrate includes polyimide.

In an embodiment, the plurality of grooves includes a first groove extending in a first direction along a first edge of the first area, a second groove extending in the first direction along a second edge of the first area spaced apart from the first edge, and at least one third groove extending in the first direction between the first edge and the second edge.

In an embodiment, the first area is bent with respect to a reference axis defined in the first area and extending in the first direction.

According to an aspect, the groove is provided to the first film and the adhesive layer to overlap with the bending area, and thus the display module may be easily bent in the bending area, and the radius of curvature of the display module may become small.

According to the manufacturing method of the display device, the first film and the adhesive layer may be selectively removed without damaging the base substrate.

BRIEF DESCRIPTION OF THE DRAWINGS

The above and other aspects and advantages of the present disclosure will become readily apparent by reference to the following detailed description when considered in conjunction with the accompanying drawings wherein:

FIG. 2 is a plan view showing a mother substrate according to an exemplary embodiment of the present disclosure;

FIG. 4 is a cross-sectional view taken along a line I-I' of FIG. 3;

FIG. 5 is a cross-sectional view showing a stacking structure of a display panel of FIG. 4;

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary.

Accordingly, those of ordinary skill in the art will recognize that various changes and modifications of the various embodiments described herein can be made without departing from the scope and spirit of the present disclosure.

It will be understood that when an element or layer is referred to as being "on," "connected to," or "coupled to" another element or layer, it can be directly on, connected, or coupled to the other element or layer, or intervening elements or layers may be present. In contrast, when an element is referred to as being "directly on," "directly connected to," or "directly coupled to" another element or layer, there are no intervening elements or layers present.

Hereinafter, the present invention will be explained in further detail with reference to the accompanying drawings.

Figure 1:
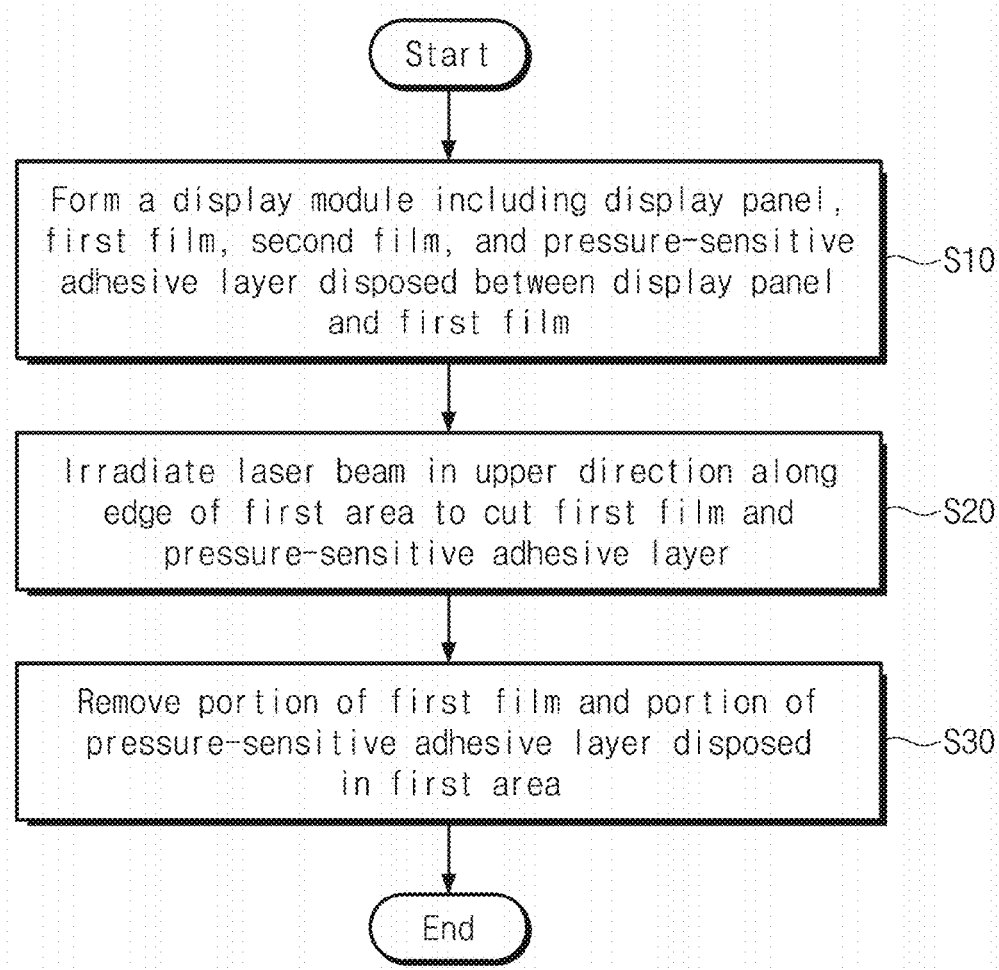
FIG. 1 is a flowchart showing a method of manufacturing a display device according to an exemplary embodiment of the present disclosure.
Figure 3:
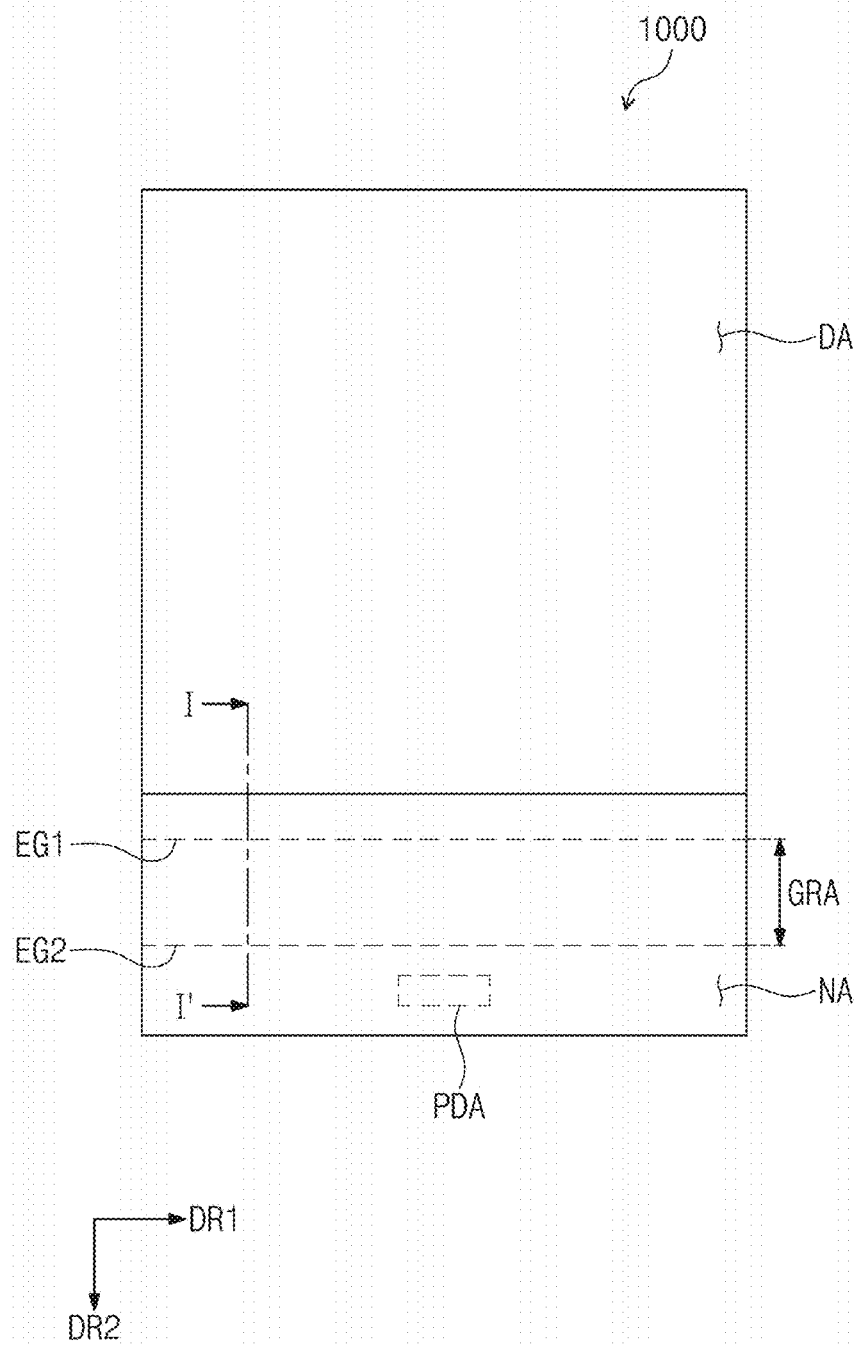
FIG. 3 is a plan view showing a display module of FIG. 2.
Figure 7:
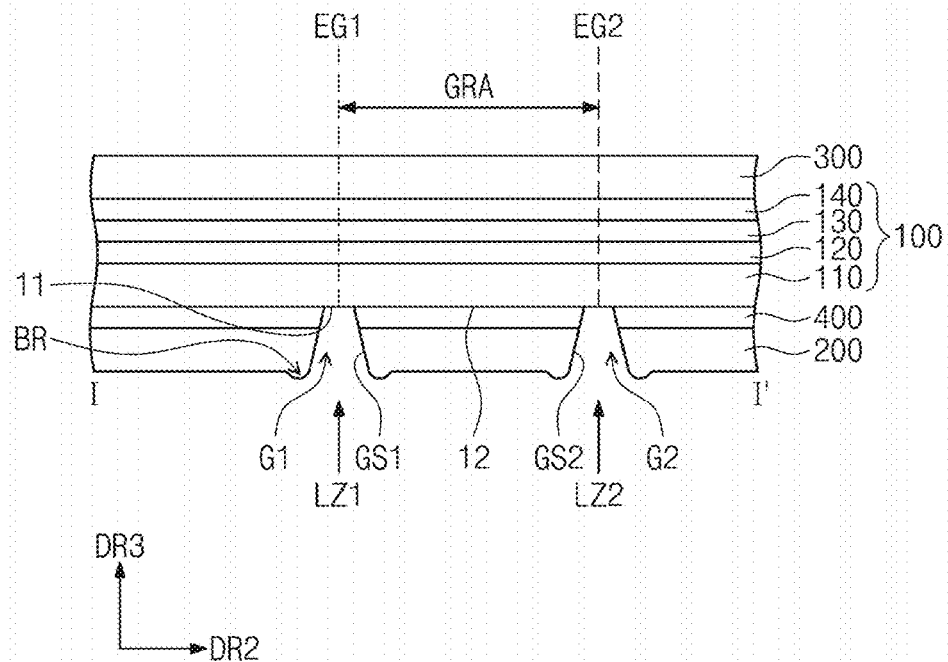
FIGS. 7 and 8 are cross-sectional views taken along the line I-I' of FIG. 3.
Figure 8:
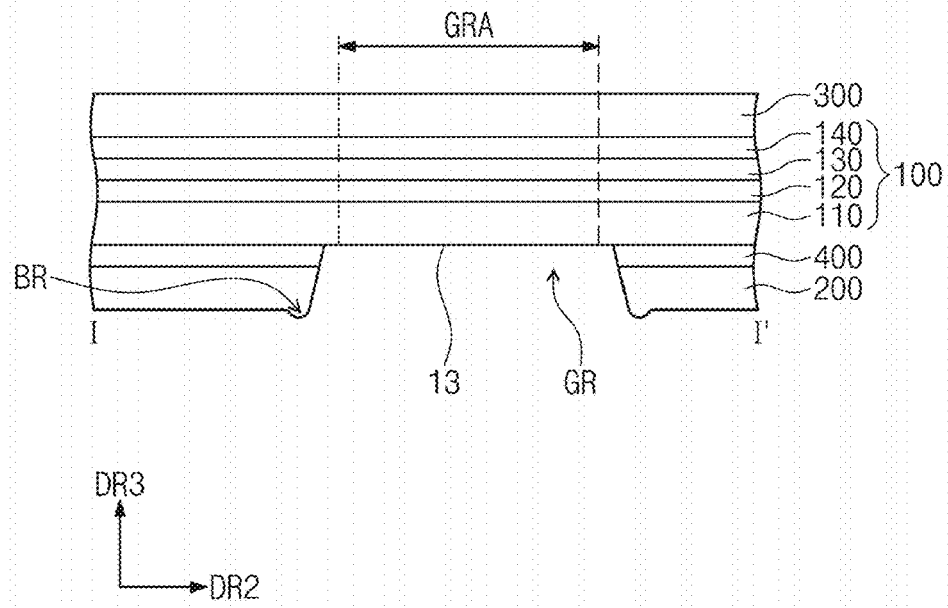

FIG. 1 is a flowchart showing a method of manufacturing a display device according to an exemplary embodiment of the present disclosure; FIG. 2 is a plan view showing a mother substrate according to an exemplary embodiment of the present disclosure; FIG. 3 is a plan view showing a display module of FIG. 2; and FIGS. 4, 7, and 8 are cross-sectional views taken along a line I-I' of FIG. 3.

Referring to FIGS. 1 and 2, a mother substrate 2000 including a display module 1000 is formed (S10).

The mother substrate 2000 includes a plurality of display modules 1000 and a dummy part DM. The display modules 1000 are formed using one substrate.

In FIG. 2, the mother substrate 2000 including six display modules 1000 is shown, but the number of the display modules 1000 is not limited to six. That is, the number of the display modules 1000 included in one mother substrate 2000 may be greater than or less than six.

The display modules 1000 and the dummy part DM may be flexible. Accordingly the mother substrate 2000 may be flexible.

Each of the display modules 1000 may display an image in response to a signal applied thereto. Each of the display modules 1000 may include any of various types of display panels, but hereinafter, the display modules 1000 including an organic light emitting display panel will be described.

The dummy part DM may be disposed between the display modules 1000. The dummy part DM may be disposed adjacent to an edge of each of the display modules 1000 to surround the display modules 1000. The dummy part DM may be finally removed in the manufacturing process of the display device.

Hereinafter, directions in which two adjacent sides of the display module 1000 extend are respectively referred to as a first direction DR1 and a second direction DR2. In FIG. 2, the first direction DR1 corresponds to a direction in which short sides of the display module 1000 extend, and the second direction DR2 corresponds to a direction in which long sides of the display module 1000 extend. However, the first direction DR1 and the second direction DR2 may be changed with respect to each other according to embodiments.

Referring to FIG. 3, the display module 1000 includes a display area DA and a non-display area NA defined therein when viewed in a plan view. The image is displayed through the display area DA and not displayed through the non-display area NA. The non-display area NA is disposed adjacent to the display area DA.

In FIG. 3, the non-display area NA is disposed adjacent to one side of the display area DA. In one embodiment, the display area DA and the non-display area NA are disposed adjacent to each other in the second direction DR2, but are not limited thereto or thereby. That is, the non-display area may be further defined adjacent to one or more of the other three sides of the display area DA.

A pad area PDA may be defined in the non-display area NA. The pad area PDA is connected to a flexible printed circuit board (not shown), and the display module 1000 receives signals required to drive itself through the pad area PDA.

A first area GRA may be further defined in the non-display area NA. The first area GRA may be defined between the pad area PDA and the display area DA and spaced apart from the pad area PDA and the display area DA. The first area GRA may correspond to an area in which a groove is defined when the organic light emitting display device according to the present disclosure is completely manufactured.

The first area GRA crosses the display module 1000 in the first direction DR1 when viewed in a plan view. A first edge EG1 and a second edge EG2 of the first area GRA extend in the first direction DR1 and are spaced apart from each other.

Referring to FIG. 4, the display module 1000 includes a display panel 100, a first film 200, a second film 300, and an adhesive layer 400.

The display panel 100 includes a lower surface 101 and an upper surface 102. Hereinafter, a direction substantially vertical to the lower surface 101 or the upper surface 102 of the display panel 100 and extending toward the upper surface 102 from the lower surface 101 of the display panel 100 is referred to as an upper direction DR3.

The first film 200 is disposed under the lower surface 101 of the display panel 100. The second film 300 is disposed above the upper surface 102 of the display panel 100. The adhesive layer 400 is disposed between the lower surface 101 of the display panel 100 and the first film 200.

The first film 200 may protect the display panel 100. The first film 200 may include polyethylene terephthalate (PET), polyethylene naphthalate (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), or modified polythenylene oxide (MPPO). In the present exemplary embodiment, the first film 200 may include polyethylene terephthalate (PET) as a representative example.

The second film 300 may include a polarizing plate. The polarizing plate may block an external light incident thereto. The polarizing plate may include a linear polarizing layer and a $\lambda/4$ retardation layer. In further detail, the linear polarizing layer may be disposed on the $\lambda/4$ retardation layer. The external light sequentially passing through the linear polarizing layer and the $\lambda/4$ retardation layer may be reflected by a lower portion of the polarizing plate, e.g., a cathode of the display panel 100, and the reflected external light may become extinct since the reflected external light does not pass through the linear polarizing layer after passing through the $\lambda/4$ retardation layer.

The adhesive layer 400 adheres the display panel 100 to the first film 200. The adhesive layer 400 may include a urethane-based material, an acrylic-based material, or a silicon-based material. The adhesive layer 400 may be a pressure-sensitive adhesive layer.

Figure 6:
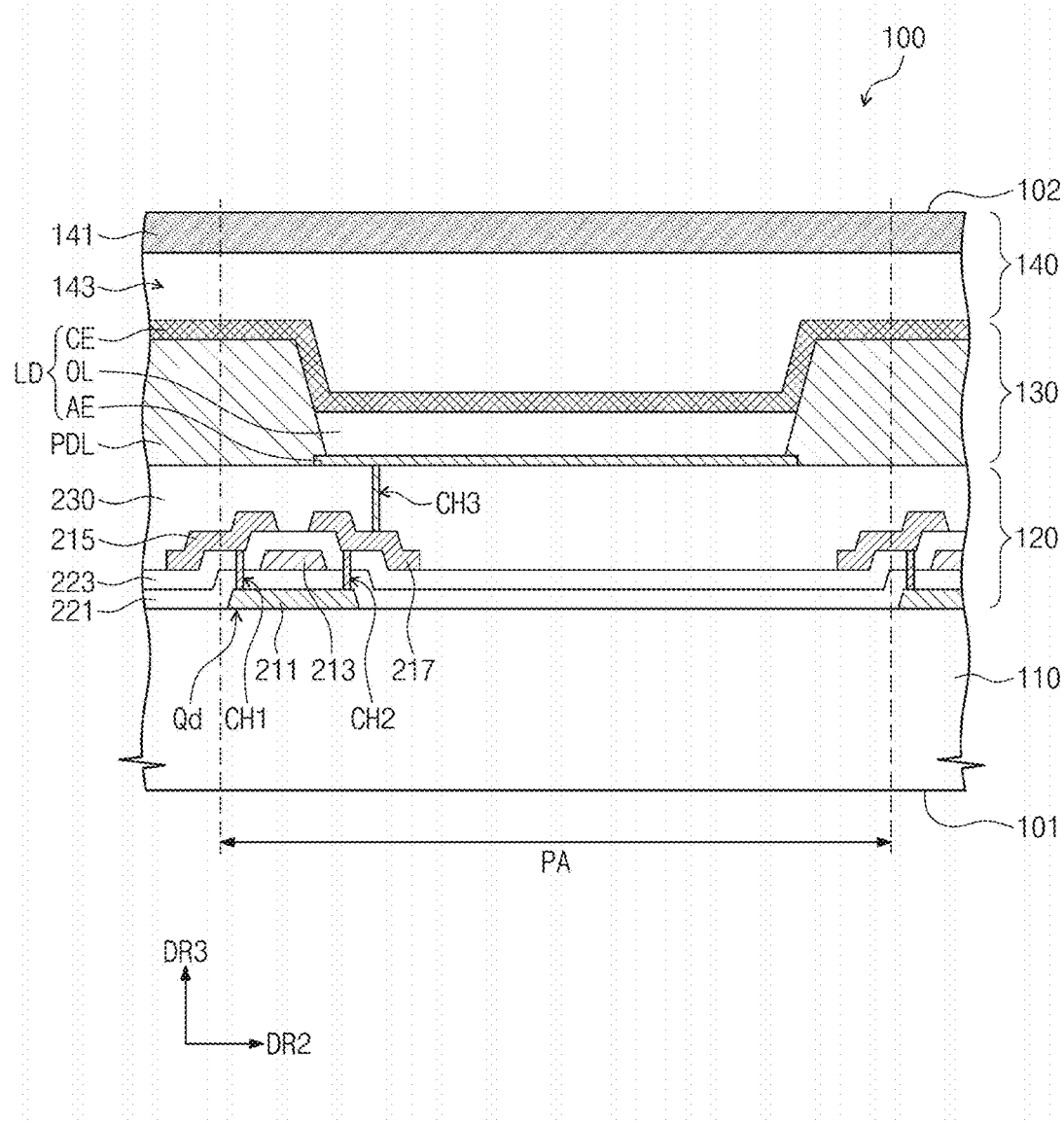
FIG. 6 is a cross-sectional view showing a portion of a display panel corresponding to one pixel area.

FIG. 5 is a cross-sectional view showing a stacking structure of the display panel 100; and FIG. 6 is a cross-sectional view showing a portion of the display panel 100 corresponding to one pixel area. As shown in FIG. 6, one pixel is disposed in one pixel area PA.

Referring to FIGS. 5 and 6, the display panel 100 includes a base substrate 110, a driving layer 120, an organic light emitting element layer 130, and a sealing layer 140.

The base substrate 110 provides the lower surface 101 of the display panel 100. The base substrate 110 may be, but is not limited to, a flexible substrate and may include a plastic material having superior thermal resistance and durability, e.g., polyethylene terephthalate (PET), polyethylene naphthalate (PEN), polycarbonate (PC), polyarylate (PAR), polyetherimide (PEI), polyethersulfone (PES), polyimide (PI), etc. The base substrate 110 may include polyimide as a representative example.

The driving layer 120 includes devices to apply signals to the organic light emitting element layer 130. The driving layer 120 includes various signal lines, such as a scan line (not shown), a data line (not shown), a power source line (not shown), a light emitting line (not shown), etc. The driving layer 120 includes a plurality of transistors and capacitors. The transistors include a switching transistor (not shown) and a driving transistor Qd, which are arranged in every one pixel (not shown).

FIG. 6 shows the driving transistor Qd of the driving layer 120 as a representative example. The driving transistor Qd includes an active layer 211, a gate electrode 213, a source electrode 215, and a drain electrode 217.

The active layer 211 is disposed on the base substrate 110. The driving layer 120 further includes a first insulating layer 221 disposed between the active layer 211 and the gate electrode 213. The first insulating layer 221 insulates the active layer 211 from the gate electrode 213. The source electrode 215 and the drain electrode 217 are disposed on the gate electrode 213. The driving layer 120 further includes a second insulating layer 223 disposed between the gate electrode 213 and the source electrode 215 and between the gate electrode 213 and the drain electrode 217. The source electrode 215 and the drain electrode 217 are connected to the active layer 211 respectively through contact holes CH1 and CH2 formed through the first insulating layer 221 and the second insulating layer 223.

The driving layer 120 further includes a protective layer 230 disposed on the source electrode 215 and the drain electrode 217.

The present disclosure is not limited to the structure of the driving transistor Qd shown in FIG. 6, and positions of the active layer 211, the gate electrode 213, the source electrode 215, and the drain electrode 217 may be changed in various ways. For instance, the gate electrode 213 is disposed on the active layer as shown in FIG. 6, but the gate electrode 213 may be disposed under the active layer 211 according to embodiments.

Although a structure of the switching transistor is not shown in FIG. 6, but the switching transistor (not shown) may have substantially the same structure as that of the driving transistor Qd. However, the switching transistor may have a structure different from that of the driving transistor Qd according to embodiments. For instance, an active layer (not shown) of the switching transistor (not shown) may be disposed on a layer different from a layer on which the active layer 211 of the driving transistor Qd is disposed.

The organic light emitting element layer 130 may include an organic light emitting diode LD. In the present exemplary embodiment, the organic light emitting diode LD may be a front surface light emitting type organic light emitting diode LD, and thus the organic light emitting diode LD may emit a light to the upper direction DR3.

The organic light emitting diode LD includes a first electrode AE, an organic layer OL, and a second electrode CE.

The first electrode AE is disposed on the protective layer 230. The first electrode AE is connected to the drain electrode 217 through a contact hole CH3 formed through the protective layer 230.

The first electrode AE may be a pixel electrode or a positive electrode. The first electrode AE may be a transflective electrode or a reflective electrode. In the case where the first electrode AE is the transflective electrode or the reflective electrode, the first electrode AE may include Ag, Mg, Al, Pt, Pd, Au, Ni, Nd, Ir, Cr, or a mixture thereof.

The first electrode AE has a single-layer structure of a metal oxide or a metal or has a multi-layer structure of layers. For instance, the first electrode AE may have a single-layer structure of ITO, Ag, or a mixture of metal, e.g., a mixture of Ag and Mg, a double-layer structure of ITO/Mg or ITO/MgF, or a triple-layer structure of ITO/Ag/ITO, but is not limited thereto or thereby.

The organic layer OL may include an organic light emitting layer containing a low molecular weight or high molecular weight organic material. The organic light emitting layer may emit the light. The organic layer OL may selectively include a hole transport layer, a hole injection layer, an electron transport layer, and an electron injection layer in addition to the organic light emitting layer.

Holes and electrons are injected into the organic light emitting layer of the organic layer OL from the first electrode AE and the second electrode CE, and the holes are recombined with the electrons in the organic light emitting layer to generate excitons. The excitons emit energy discharged when an excited state returns to a ground state as light.

The second electrode CE is disposed on the organic layer OL. The second electrode CE may be a common electrode or a negative electrode. The second electrode CE may be a transmissive electrode or a transflective electrode. In the case where the second electrode CE is the transmissive electrode or the transflective electrode, the second electrode CE may include Li, Ca, LiF/Ca, LiF/Al, Al, Mg, BaF, Ba, Ag, a compound thereof, or a mixture thereof, e.g., a mixture of Ag and Mg.

The second electrode CE may include an auxiliary electrode. The auxiliary electrode may include indium tin oxide (ITO), indium zinc oxide (IZO), zinc oxide (ZnO), indium tin zinc oxide (ITZO), Mo, Ti, Ag, etc.

The organic light emitting element layer 130 may further include a pixel definition layer PDL disposed on the protective layer 230. The pixel definition layer PDL may be disposed to overlap with a boundary of the pixel area PA when viewed in a plan view.

The sealing layer 140 is disposed above the organic light emitting element layer 130. The sealing layer 140 provides the upper surface 102 of the display panel 100. The sealing layer 140 blocks the organic light emitting element layer 130 from external moisture and oxygen. The sealing layer 140 includes a sealing substrate 141 and a sealing member (not shown). The sealing member (not shown) is disposed along an edge of the sealing substrate 141 and seals the organic light emitting diode LD together with the sealing substrate 141. An inner space 143 defined by the sealing substrate 141 and the sealing member (not shown) is maintained in a vacuum state. However, the inner space 143 may be filled with nitrogen ($N_2$) or with a filling member of an insulating material.

Different from the display panel 100 shown in FIG. 6, the sealing layer 140 may have a structure in which an organic layer and an inorganic layer are stacked multiple times.

Referring to FIGS. 1, 3, 4, and 7, the first film 200 and the adhesive layer 400 are cut along an edge of the first area GRA (S20).

In the cutting of the first film 200 and the adhesive layer 400 (S20), a laser beam is irradiated in the upper direction DR3 from the lower side of the display module 1000 to cut the first film 200 and the adhesive layer 400.

The laser beam may be irradiated using a $CO_2$ laser source having a high energy efficiency or the UV laser source. In an embodiment, the laser beam emitted from the $CO_2$ laser source has a wavelength from about 9.1 μm to about 10.7 μm. In an embodiment, the laser beam emitted from the UV laser source has a wavelength equal to or smaller than about 360 nm.

The cutting of the first film 200 and the adhesive layer 400 (S20) may include irradiating a laser beam LZ1 along the first edge EG1 of the first area GRA and irradiating a laser beam LZ2 along the second edge EG2 of the first area GRA.

After the cutting of the first film 200 and the adhesive layer 400 (S20), a first groove G1 is formed in the first film 200 and the adhesive layer 400 to overlap with the first edge EG1 of the first area GRA, and a second groove G2 is formed in the first film 200 and the adhesive layer 400 to overlap with the second edge EG2 of the first area GRA.

Each of the first groove G1 and the second groove G2 may have a shape having a width which gradually decreases upward along the upper direction DR3, and an inner surface GS1 of the first groove G1 and an inner surface GS2 of the second groove G2 may be inclined.

Since the laser beams LZ1 and LZ2 are irradiated in the cutting of the first film 200 and the adhesive layer 400 (S20), a burr BR is formed on the lower surface of the first film 200 to be adjacent to the first and second grooves G1 and G2. The burr BR may be formed by a portion of the first film 200, which is melted by heat energy of the laser beams LZ1 and LZ2.

In the cutting of the first film 200 and the adhesive layer 400 (S20), a power of each of the laser beams LZ1 and LZ2 may be equal to or smaller than about 1 W. When the power of each of the laser beams LZ1 and LZ2 is equal to or smaller than about 1 W, the lower surface 101 of the display panel 100 may not be damaged, and the shape of the lower surface 101 of the display panel 100 may not be deformed.

Since the first and second grooves G1 and G2 are formed, a first portion 11 of the lower surface 101 of the base substrate 110 is exposed. In addition, since the first portion 11 of the lower surface 101 of the base substrate 110 is not physically damaged by the laser beam irradiated thereto, the first portion 11 of the lower surface 101 of the base substrate 110 may be flat. A second portion 12 of the lower surface 101 of the base substrate 110 that is between the first and second grooves G1 and G2 may be flat.

The first edge EG1 and the second edge EG2 may be defined in the first portion 11 of the lower surface 101 of the base substrate 110.

Although not shown in the figures, an adhesive force of the adhesive layer 400 disposed in the first area GRA may be weakened prior to or after the cutting of the first film 200 and the adhesive layer 400 (S20). The adhesive force of the adhesive layer 400 disposed in the first area GRA may be weakened by irradiating an ultraviolet ray to the first area GRA.

Referring to FIGS. 1, 4, and 8, the portion of the first film 200 and the portion of the adhesive layer 400, which are disposed in the first area GRA, are removed (S30).

Due to the removal of the portion of the first film 200 and the portion of the adhesive layer 400 (S30), the groove GR is formed. A third portion 13 of the lower surface 101 of the base substrate 110, which is exposed through the groove GR, may have an area greater than that of the first area GRA.

According to the manufacturing method of the display device of the present exemplary embodiment, the adhesive layer 400 and the first film 200 are formed on the entire surface of the display panel 100, and then the portion of the adhesive layer 400 and the portion of the first film 200, which are disposed in a target area, may be easily removed. According to the manufacturing method of the display device of the present exemplary embodiment, a manufacturing process may be simplified and a manufacturing cost may be reduced when compared with those of a manufacturing method of attaching a first film, from which a portion thereof corresponding to a target area is removed, to the display panel 100.

Figure 9:
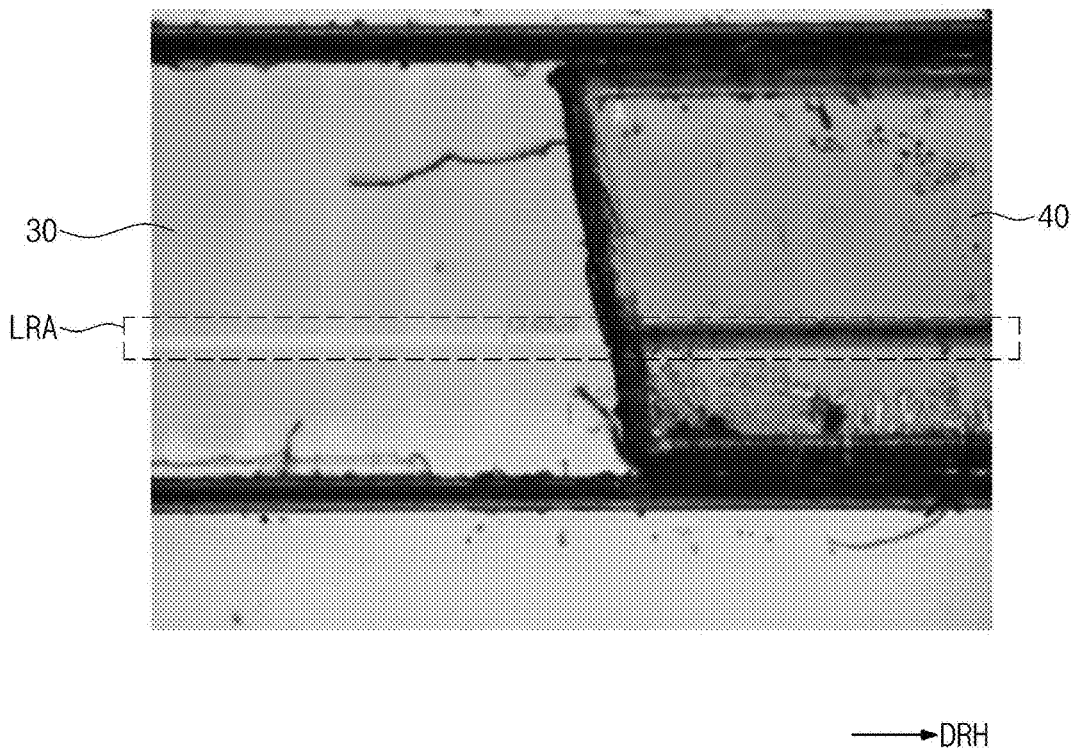
FIG. 9 is a photograph showing an experimental subject irradiated with a laser beam exceeding about 1 W.
Figure 10:
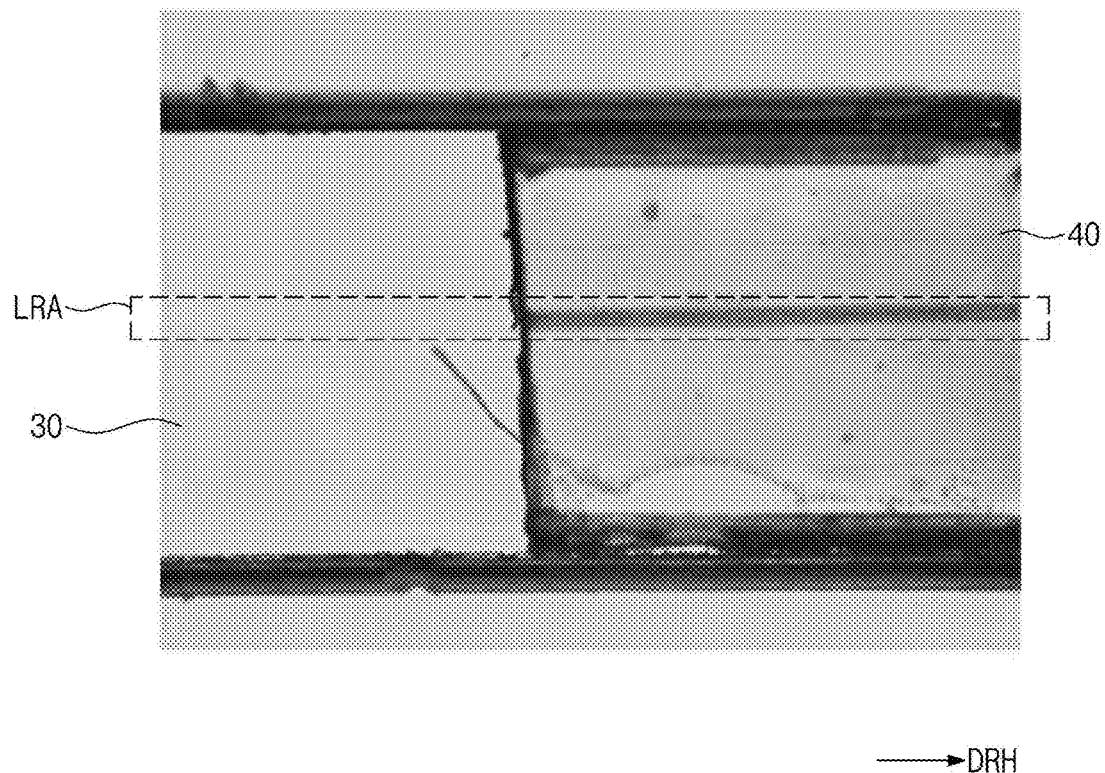
FIG. 10 is a photograph showing an experimental subject irradiated with a laser beam equal to or less than about 1 W.

FIG. 9 is a photograph showing an experimental subject irradiated with a laser beam exceeding about 1 W; and FIG. 10 is a photograph showing an experimental subject irradiated with a laser beam equal to or smaller than about 1 W. FIGS. 9 and 10 are top views of the experimental subject.

In FIGS. 9 and 10, the experimental subject was configured to include a first member 30 including polyimide (PI) and a second member 40 including polyethylene terephthalate (PET). The laser beam was irradiated to a laser irradiation area LRA along a horizontal direction DRH.

Referring to FIG. 9, the first member 30 and the second member 40 were physically processed in the laser irradiation area LRA. Referring to FIG. 10, the second member 40 was physically processed in the laser irradiation area LRA, and the first member 30 was not physically processed in the laser irradiation area LRA.

Referring to FIGS. 7, 9, and 10, in a case in which the adhesive layer 400 has a thickness of about 10 μm, it is difficult to precisely cut only the adhesive layer 400 when considering a depth margin controlled by the laser source. According to the present exemplary embodiment, in the case in which the power of the laser beam applied to the polyimide is equal to or smaller than about 1 W, the polyimide is not physically processed. Accordingly, the first film 200 and the adhesive layer 400 (e.g., a pressure-sensitive adhesive layer) may be selectively removed without damaging the base substrate 110.

Then, the display modules 1000 may be separated from the mother substrate 2000 by removing the dummy part DM from the mother substrate 2000, but is not limited thereto or thereby. That is, the separation of the display modules 1000 from the mother substrate 2000 may be performed prior to the cutting process of the first film and the adhesive layer (S20) and the removing the portion of the first film and the portion of the adhesive layer (S30).

In an embodiment, the display module 1000 is bent with respect to a reference axis defined in the first area GRA and extending in the first direction DR1. The display module 1000 may be bent such that two parts of the first film 200, which are separated by the groove GR, are closer to each other.

Figure 11:
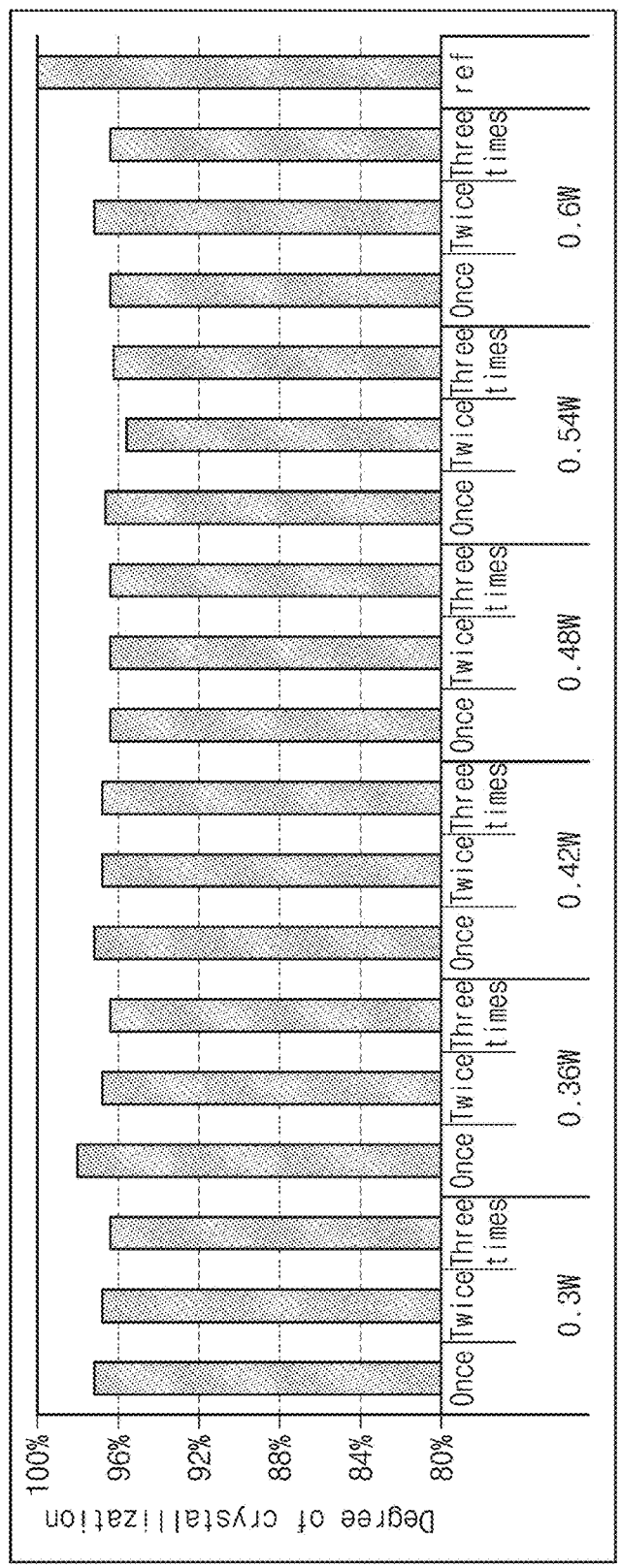
FIG. 11 is a graph showing a degree of crystallization of polyimide according to a power of a laser beam.

FIG. 11 is a graph showing a degree of crystallization (hereinafter, referred to as "crystallization degree") of polyimide according to a power of a laser beam.

In FIG. 11, "ref" indicates a reference condition when the laser beam is not irradiated to polyimide, and the crystallization degree in the reference condition was set to 100%. Laser irradiation was performed three times with each laser power of about 0.3 W, about 0.36 W, about 0.42 W, about 0.48 W, about 0.54 W, and about 0.6 W. The laser power was controlled by sequentially increasing a repetition rate of the laser source without changing a spot size of the laser beam.

Referring to FIG. 11, even though the laser power was increased, the crystallization degree of polyimide was maintained at about 95% or more of the reference condition. In addition, in the case where the laser beam was irradiated three times at the same laser power, the crystallization degree of polyimide was maintained at about 95% or more of the reference condition. In addition, in the case that the laser beam is irradiated, the crystallization degree of polyimide was lower by about 5% than the reference condition.

Referring to FIGS. 9 to 11, although the laser beam at a specific laser power is irradiated to polyimide, polyimide is not physically processed, but the degree of crystallization of polyimide may be varied by about 5%.

Figure 12:
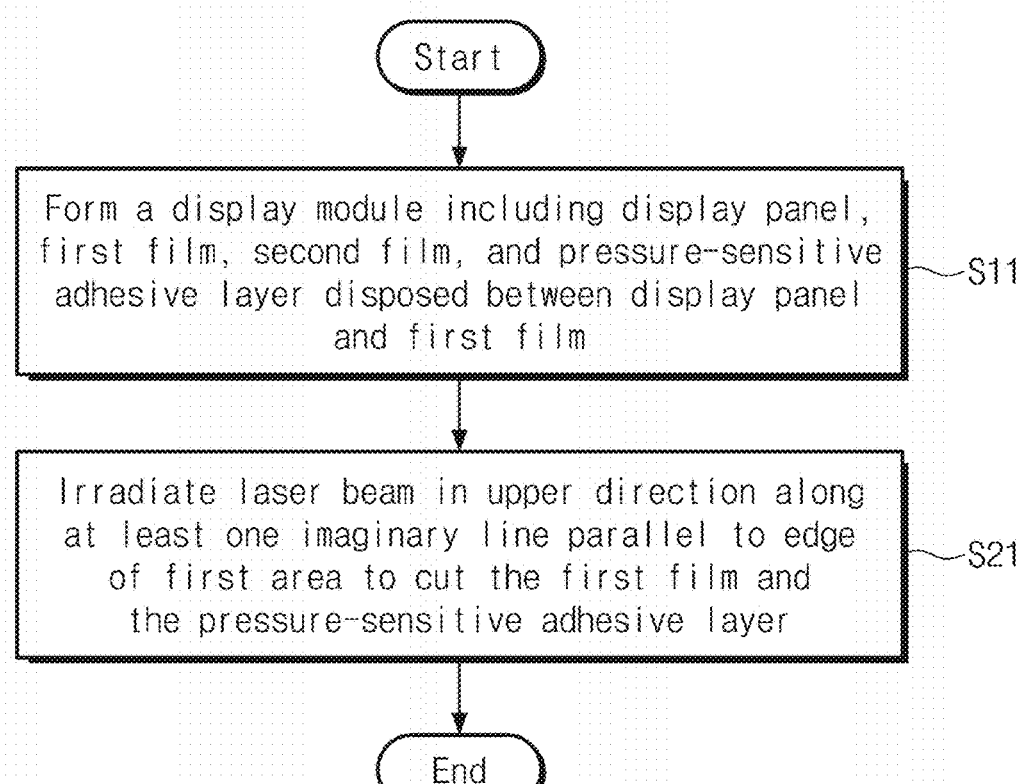
FIG. 12 is a flowchart showing a manufacturing method of a display device according to another exemplary embodiment of the present disclosure.
Figure 13:
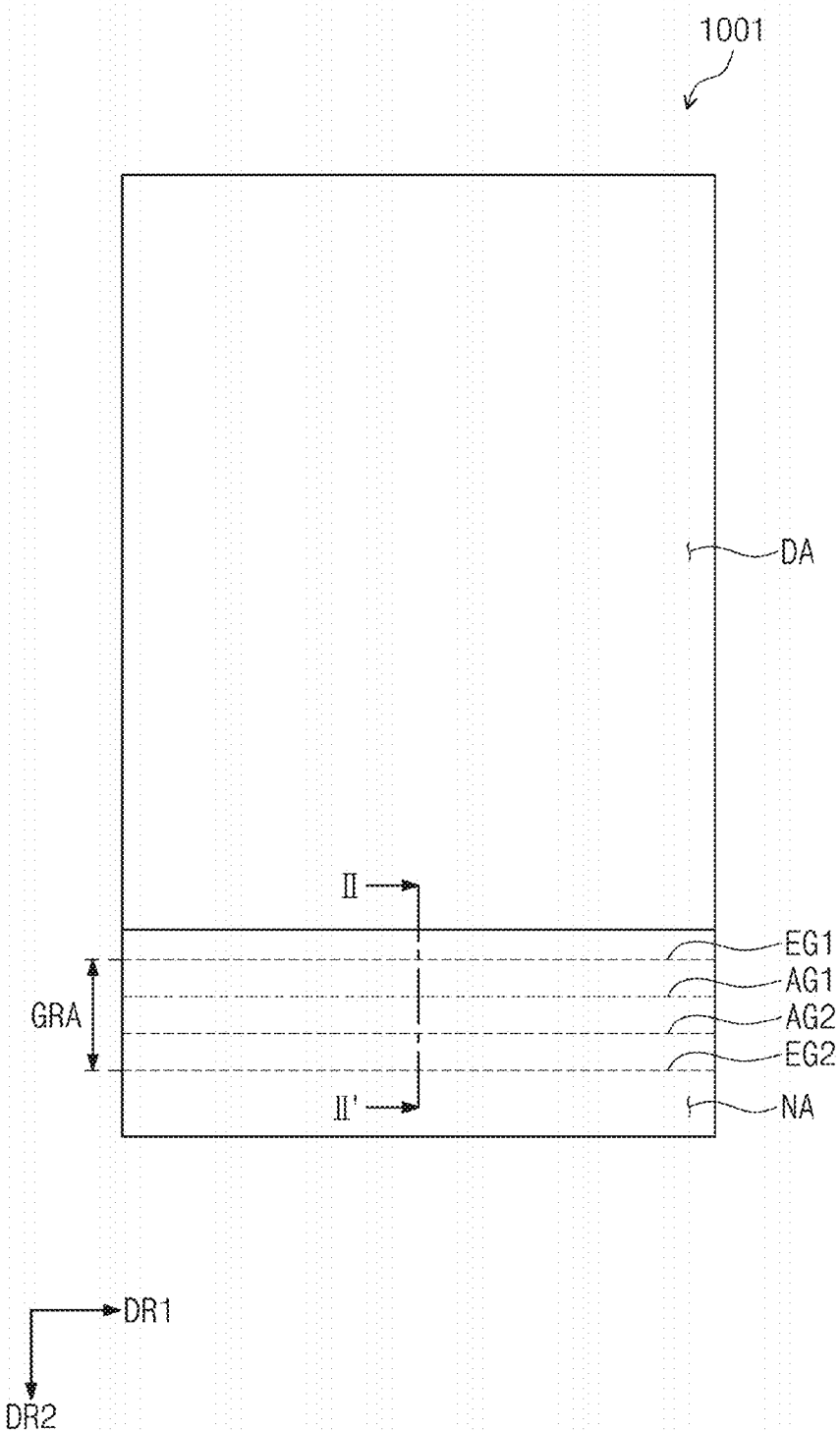
FIG. 13 is a plan view showing a display module illustrating a manufacturing method of a display device according to another exemplary embodiment of the present disclosure.

FIG. 12 is a flowchart showing a manufacturing method of a display device according to another exemplary embodiment of the present disclosure; FIG. 13 is a plan view showing a display module illustrating a manufacturing method of a display device according to another exemplary embodiment of the present disclosure; and FIG. 14 is a cross-sectional view taken along a line II-II' of FIG. 13.

Referring to FIG. 12, operation (S11) is substantially the same as the forming process (S10) described with reference to FIGS. 1 and 2, and thus further details thereof will be omitted.

Figure 14:
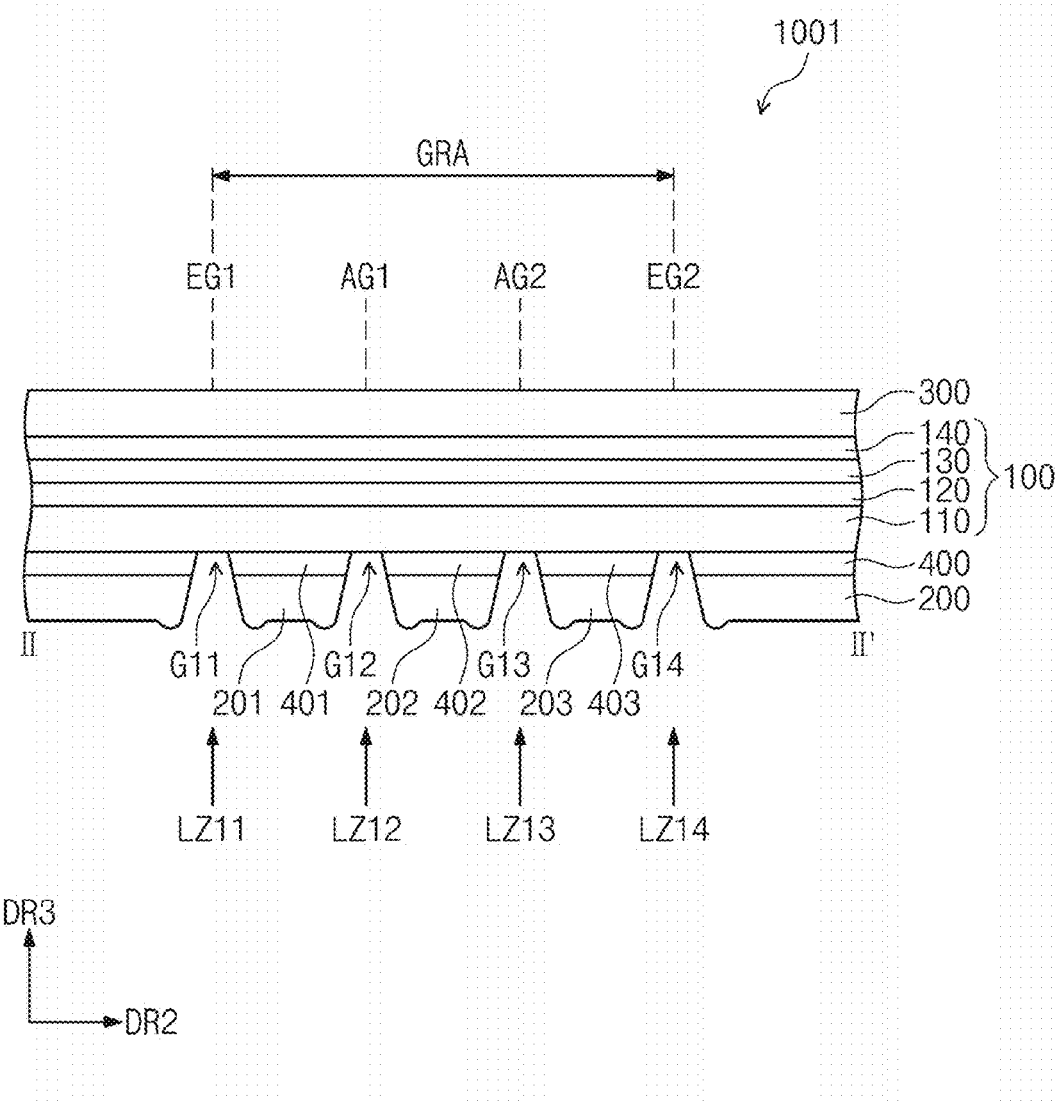
FIG. 14 is a cross-sectional view taken along a line II-II' of FIG. 13.

Referring to FIGS. 12 to 14, the cutting of the first film and the adhesive layer (S21) may include irradiating a laser beam LZ11 along the first edge EG1 of the first area GRA, irradiating laser beams LZ12 and LZ13 to the first area GRA along imaginary lines AG1 and AG2 substantially parallel to the first edge EG1 at least once, and irradiating a laser beam LZ14 along the second edge EG2 of the first area GRA.

In FIGS. 13 and 14, the laser beams LZ12 and LZ13 are irradiated along the two imaginary lines AG1 and AG2 in the first area GRA, but the number of the imaginary lines is not limited to two. For example, the laser beam may be irradiated along three or more imaginary lines.

In the cutting of the first film and the adhesive layer (S21), the laser power of each of the laser beams LZ11, LZ12, LZ13, and LZ14 provided to the base substrate 110 may be equal to or smaller than about 1 W.

After the cutting of the first film and the adhesive layer (S21), a first groove G11 is formed in the first film 200 and the adhesive layer 400 to overlap with the first edge EG1 of the first area GRA, a second groove G12 is formed in the first film 200 and the adhesive layer 400 to overlap with the first imaginary line AG1, a third groove G13 is formed in the first film 200 and the adhesive layer 400 to overlap with the second imaginary line AG2, and a fourth groove G14 is formed in the first film 200 and the adhesive layer 400 to overlap with the second edge EG2 of the first area GRA.

Each of the first to fourth grooves G11 to G14 may have a shape having a width which gradually decreases upward along the upper direction DR3.

Different from the manufacturing method of the display device described with reference to FIG. 1, the manufacturing method of the display device does not include the removing of the portion of the first film 200 and the portion of the adhesive layer 400 disposed in the first area GRA.

In a display module 1001 shown in FIGS. 13 and 14, a first portion 201 of the first film 200 and a first portion 401 of the adhesive layer 400 may be disposed between the first and second grooves G11 and G12. In addition, a second portion 202 of the first film 200 and a second portion 402 of the adhesive layer 400 may be disposed between the second and third grooves G12 and G13. Further, a third portion 203 of the first film 200 and a third portion 403 of the adhesive layer 400 may be disposed between the third and fourth grooves G13 and G14.

The first portion 201 of the first film 200 and the first portion 401 of the adhesive layer 400 may be separated from the second portion 202 of the first film 200 and the second portion 402 of the adhesive layer 400 by the second groove G12. The second portion 202 of the first film 200 and the second portion 402 of the adhesive layer 400 may be separated from the third portion 203 of the first film 200 and the third portion 403 of the adhesive layer 400 by the third groove G13.

According to the manufacturing method of the display device described with reference to FIGS. 12 to 14, although the portion of the first film 200 and the portion of the adhesive layer 400 disposed in the first area GRA are not removed, the display module 1001 may be easily bent in the first area GRA since the grooves G11 to G14 are formed.

However, the structure of the display device manufactured by the method shown in FIG. 12 is not limited to the structure of the display device shown in FIG. 14. In the cutting of the first film and the adhesive layer (S21), the laser beam irradiated along three or more imaginary lines in the first area GRA, and thus the portion of the first film 200 and the portion of the adhesive layer 400, which are disposed in the first area GRA, may be completely removed. That is, since the grooves overlapped with the first film 200 and the adhesive layer 400 are formed in the first area GRA, the portion of the first film 200 and the portion of the adhesive layer 400, which are disposed in the first area GRA, may be completely removed without performing a separate additional process.

Figure 15:
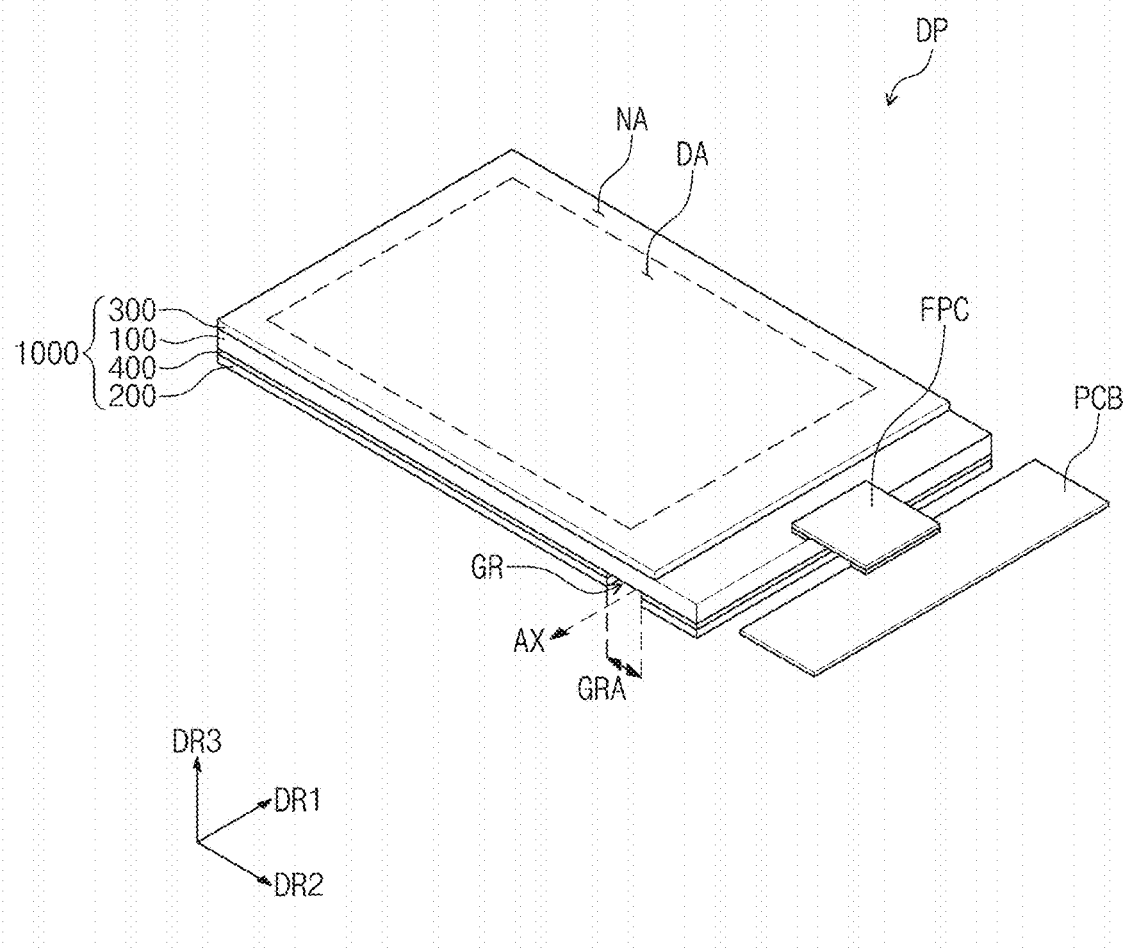
FIG. 15 is a perspective view showing an organic light emitting display device according to an exemplary embodiment of the present disclosure.
Figure 16:
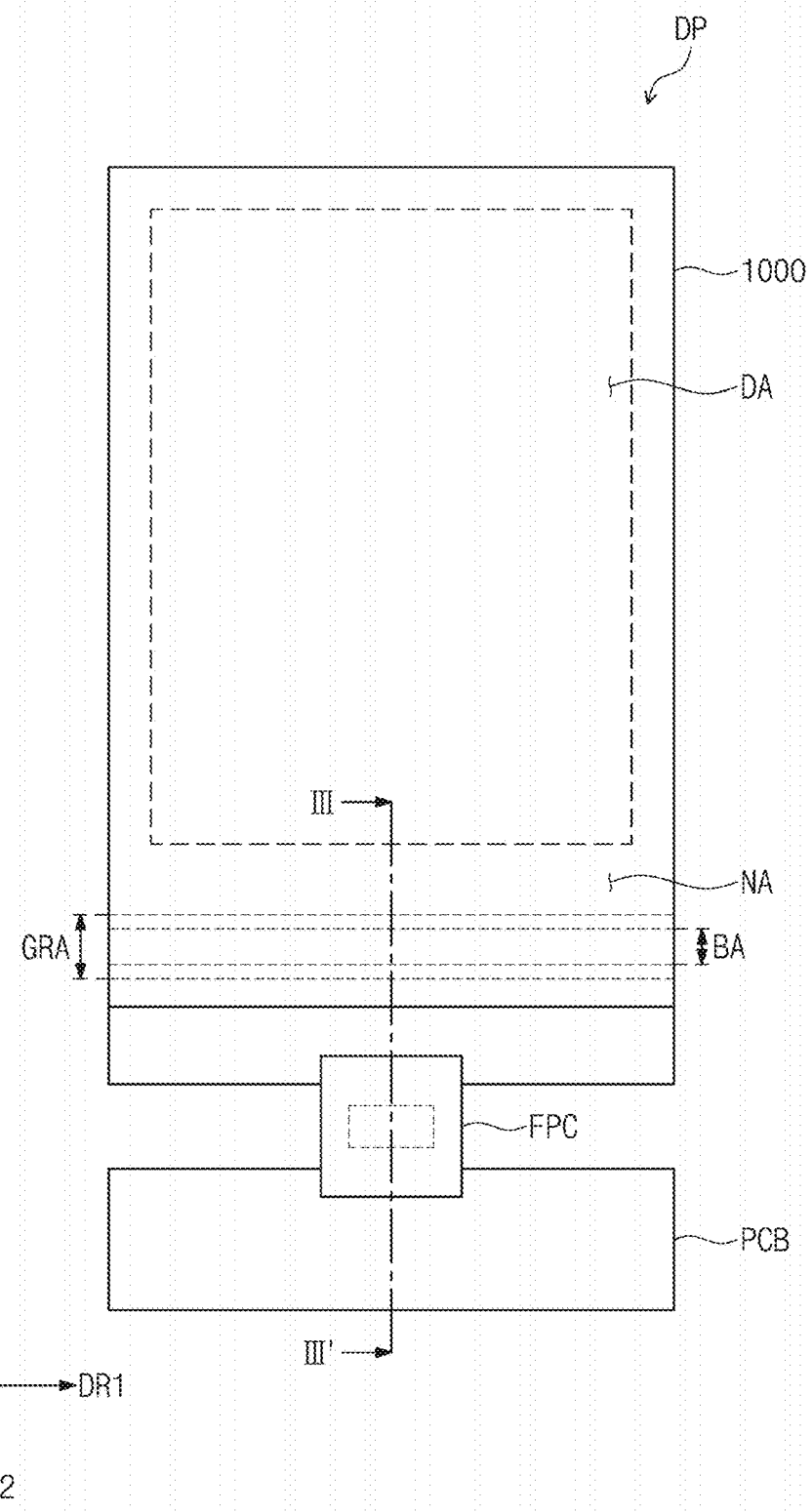
FIG. 16 is a plan view showing the organic light emitting display device of FIG. 15.
Figure 17:
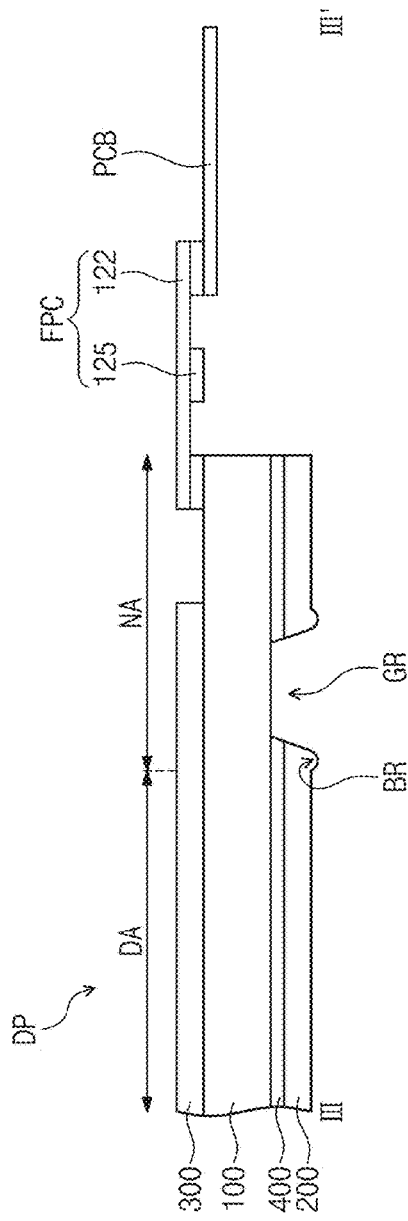
FIG. 17 is a cross-sectional view taken along a line III-III' of FIG. 16.
Figure 18:
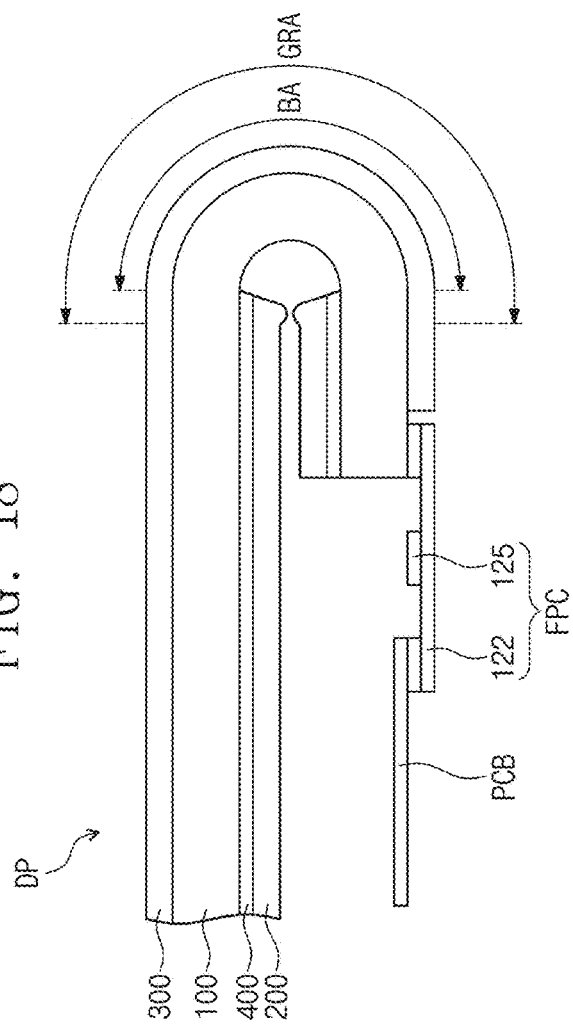
FIG. 18 is a cross-sectional view taken along the line III-III' of FIG. 16 when the organic light emitting display device is bent.

FIG. 15 is a perspective view showing an organic light emitting display device according to an exemplary embodiment of the present disclosure; FIG. 16 is a plan view showing the organic light emitting display device of FIG. 15; FIG. 17 is a cross-sectional view taken along a line III-III' of FIG. 16; and FIG. 18 is a cross-sectional view taken along the line III-III' of FIG. 16 when the organic light emitting display device is bent.

Referring to FIGS. 15 to 18, an organic light emitting display device DP includes the display module 1000, a flexible printed circuit board FPC, and a printed circuit board PCB.

The flexible printed circuit board FPC includes a flexible wiring board 122 and a driving circuit chip 125. The driving circuit chip 125 is electrically connected to wirings of the flexible wiring board 122.

In the case where the flexible printed circuit board FPC includes the driving circuit chip 125, data pads electrically connected to data lines and control signal pads electrically connected to control signal lines are arranged in a pad area (not shown) of the display panel 100. The data lines are connected to transistors arranged in the pixel, and the control signal lines are connected to a scan driving circuit. In the present exemplary embodiment, the flexible printed circuit board FPC is provided in a chip-on-film package, but is not limited thereto or thereby. According to another embodiment, the driving circuit chip 125 may be mounted on the non-display area NA of the display panel 100, and the flexible printed circuit board FPC may be a flexible wiring board.

The printed circuit board PCB is electrically connected to the display panel 100 through the flexible wiring board 122 to transmit and receive signals to and from the driving circuit chip 125. The printed circuit board PCB provides at least one of image data, a control signal, and a power source voltage to the display panel 100 or the flexible printed circuit board FPC. The printed circuit board PCB may include active elements and passive elements. The printed circuit board PCB may include a pad part (not shown) connected to the flexible printed circuit board FPC.

The display module 1000 displays the image to the upper direction DR3.

The display module 1000 has a structure formed by the manufacturing method of the organic light emitting display device according to embodiments of the present disclosure. Herein, the display module 1000 will be described in further detail, and the same descriptions as those of FIGS. 1 to 8 will not be reiterated.

The display module 1000 may be bent with respect to a reference axis AX extending in the first direction DR1. The reference axis AX may be defined under the display module 1000. The display module 1000 may be bent such that two parts of the first film 200, which are divided by the groove GR, are closer to each other.

The display module 1000 may be bent in the first area GRA. A bending area BA may be defined in the display module 1000. The display module 1000 may be flat in an area other than the bending area BA. The bending area BA may have a width smaller than that of the first area GRA.

Since the adhesive layer 400 and the first film 200 have resilience when the adhesive layer 400 and the first film 200 are bent and the display module 1000 requires more force to maintain the bent state as a thickness of the display module 1000 increases, removing the adhesive layer 400 and the first film 200 in the bending area BA facilitates bending the display module 1000. According to the display device of the present exemplary embodiment, the groove GR is provided to the first film 200 and the adhesive layer 400 to overlap with the bending area BA, and thus the display module 1000 may be easily bent in the bending area BA, and a radius of curvature of the display module 1000 becomes small in the bending area BA.

Figure 19:
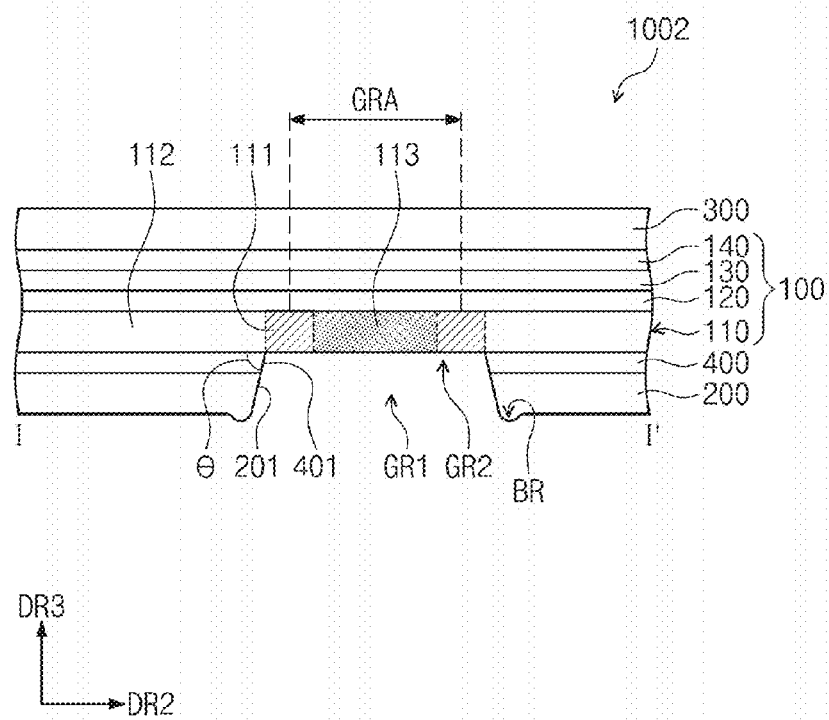
FIGS. 19 and 20 are cross-sectional views showing display modules according to exemplary embodiments of the present disclosure.
Figure 20:
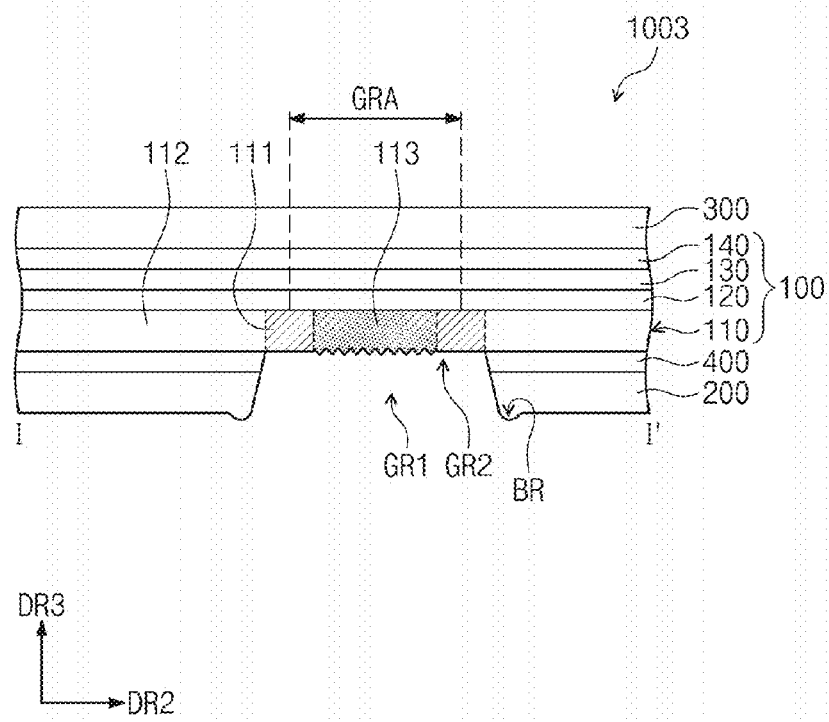

FIGS. 19 and 20 are cross-sectional views showing display modules according to exemplary embodiments of the present disclosure.

A display module 1002 may include the display panel 100, the first film 200, the second film 300, and the adhesive layer 400. A film groove GR1 may be defined in the first film 200 to overlap with the first area GRA. A groove GR2 may be defined in the adhesive layer 400 to overlap with the first area GRA.

A base substrate 110 may include a first part 111, a second part 112, and a third part 113. The first part 111 is exposed by the film groove GR1 and the adhesive groove GR2 and connected to an inner surface 401 of the adhesive groove GR2. The second part 112 is overlapped with the first film 200 and the adhesive layer 400. The third part 113 is exposed by the film groove GR1 and the adhesive groove GR2 and spaced apart from the second part 112 by the first part 111.

The first part 111 may be a part of the base substrate 110 to which the laser beams LZ1 and LZ2 are irradiated in the cutting of the first film and the adhesive layer (S20) described with reference to FIGS. 1 and 7. The second and third parts 112 and 113 may be parts of the base substrate 110 to which the laser beams LZ1 and LZ2 are not irradiated in the cutting of the first film and the adhesive layer (S20) described with reference to FIGS. 1 and 7.

The first part 111 of the base substrate 110 may have a difference in the degree of crystallization of about 5% when compared to that of each of the second and third parts 112 and 113. In further detail, the first part 111 of the base substrate 110 has a relatively small crystallization degree within about 5% when compared to that of each of the second and third parts 112 and 113. The second and third parts 112 and 113 may have substantially the same crystallization degree.

An inner surface 201 of the first film 200 providing the film groove GR1 may be connected to the inner surface 401 of the adhesive layer 400 providing the groove GR2. As shown in FIG. 19, the inner surface 201 of the first film 200 and the inner surface 401 of the adhesive layer 400 may have a straight line shape, but may have a curved shape according to other embodiments.

An angle (θ) between the lower surface of the second part 112 of the base substrate 110 (e.g., a lower surface of the display panel) and each of the inner surface 201 of the first film 200 and the inner surface 401 of the adhesive layer 400 may be an acute angle. This is because the cutting of the first film and the adhesive layer (S20) is performed by irradiating the laser beam to the upper direction DR3.

The display module 1002 may include the burr BR disposed on the lower surface of the first film 200 adjacent to the film groove GR1. The burr BR may be formed through the cutting of the first film and the adhesive layer (S20).

According to a display module 1003 shown in FIG. 20, a lower surface of the first part 111 of the base substrate 110 may have a surface roughness smaller than a surface roughness of the lower surface of the third part 113 of the base substrate 110.

The lower surface of the first part 111 is formed in the cutting of the first film 200 and the adhesive layer 400 (S20) described with reference to FIGS. 1 and 7, and the lower surface of the third part 113 is formed in the removing of the portion of the first film 200 and the portion of the adhesive layer 400 (S30) described with reference to FIGS. 1 and 8. In the removing of the portion of the first film 200 and the portion of the adhesive layer 400 (S30), the surface roughness of the lower surface of the third part 113 of the base substrate 110 may increase while the adhesive layer 400 is removed from the base substrate 100.

Figure 21:
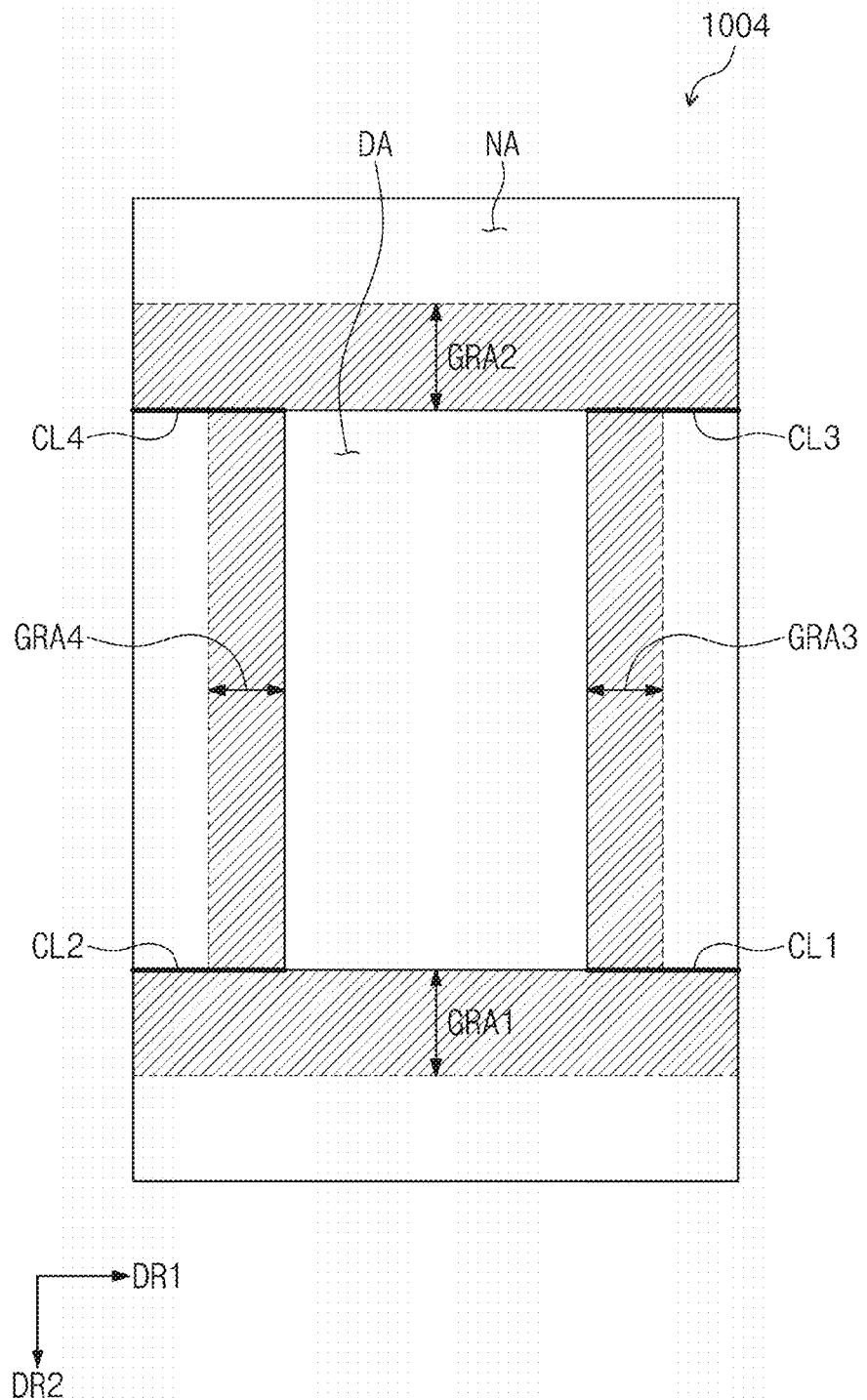
FIG. 21 is a plan view showing a display module according to another exemplary embodiment of the present disclosure.
Figure 22:
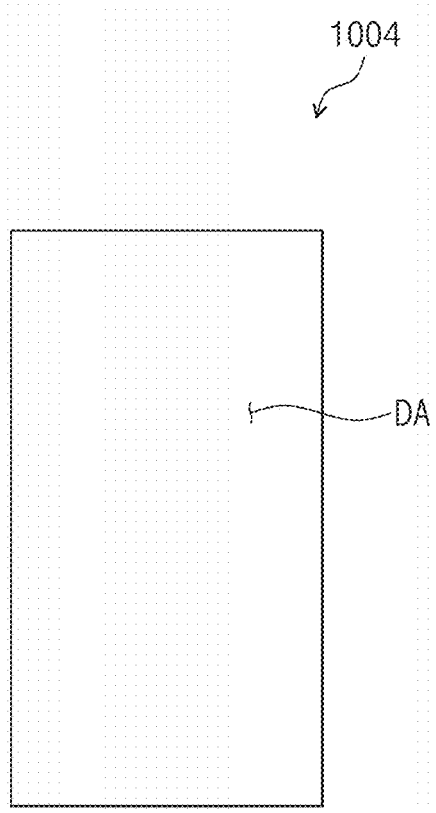
FIG. 22 is a plan view showing the display module of FIG. 21 in a bent state.

FIG. 21 is a plan view showing a display module according to another exemplary embodiment of the present disclosure; and FIG. 22 is a plan view showing the display module of FIG. 21 in a bent state.

Referring to FIG. 21, a display module 1004 may include a display area DA and a non-display area NA defined therein. The non-display area NA surrounds the display area DA. The non-display area NA may include first to fourth areas GRA1 to GRA4 defined therein.

The display module 1004 may have substantially the same layer structure as one of the display modules 1001 to 1003 described with reference to FIGS. 14, 19, and 20.

The cutting operation (S20) and the removing operation (S30) shown in FIG. 1 may be performed on the first to fourth areas GRA1 to GRA4. Accordingly, the display module 1004 may have a shape in which the first film 200 and the adhesive layer 400 are removed from the first to fourth areas GRA1 to GRA4.

First to fourth cutting lines CL1 to CL4 are provided to the display module 1004. The display module 1004 may be cut along the first to fourth cutting lines CL1 to CL4.

Referring to FIGS. 21 and 22, the display module 1004 may be bent with respect to a line extending in the first direction DR1 in each of the first and second areas GRA1 and GRA2. In addition, the display module 1004 may be bent with respect to a line extending in the second direction DR2 in each of the third and fourth areas GRA3 and GRA4.

According to the display module 1004 shown in FIGS. 21 and 22, the first film 200 and the adhesive layer 400 are removed from the first to fourth areas GRA1 to GRA4 defined respectively along four sides of the display module 1004, and the display module 1004 is bent along the four sides, but is not limited thereto or thereby. For example, the first film 200 and the adhesive layer 400 may be removed from two or three sides of the display module 1004, and the display module 1004 may be bent along two or three sides.

Figure 23:
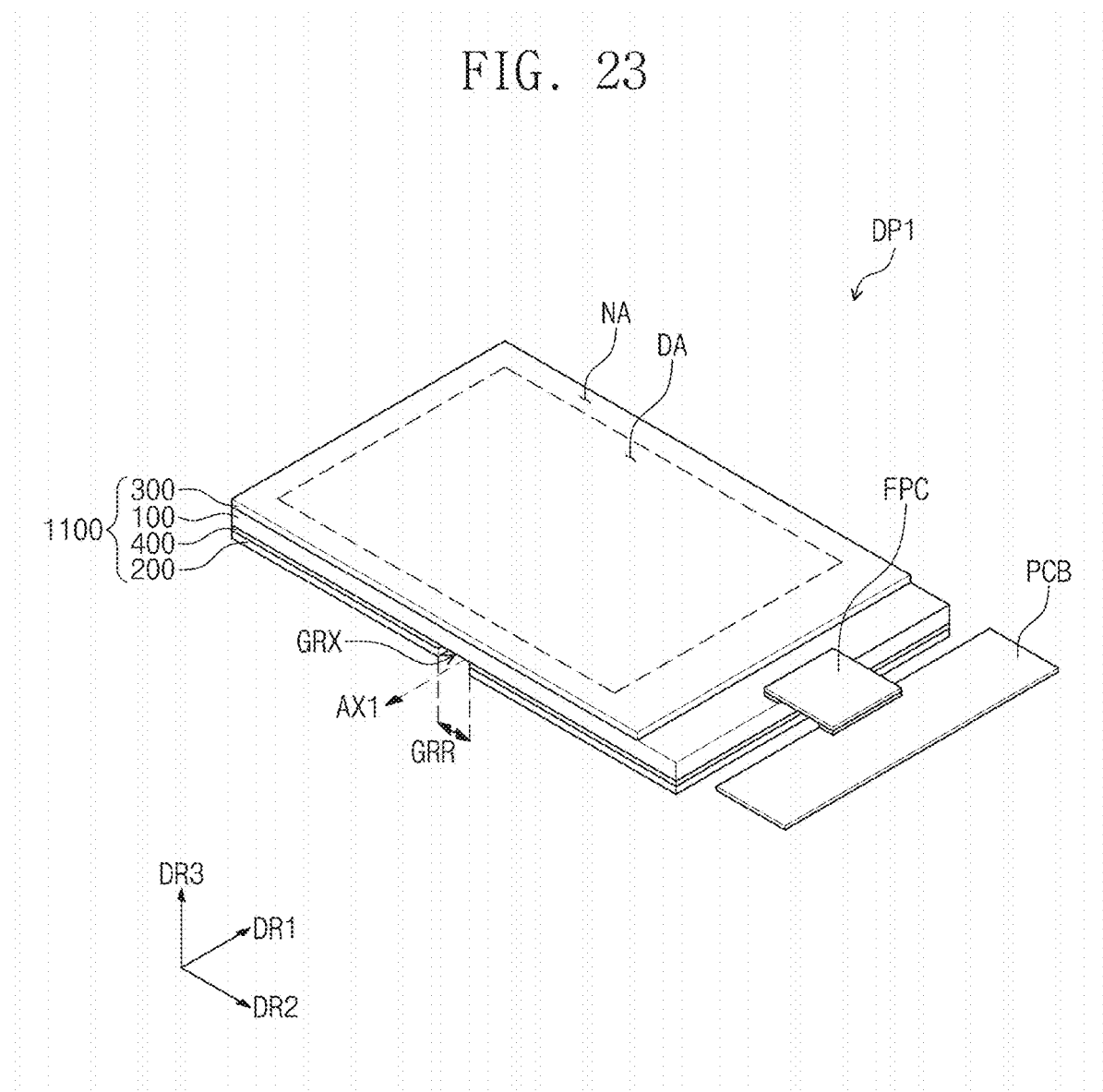
FIG. 23 is a perspective view showing an organic light emitting display device according to another exemplary embodiment of the present disclosure.
Figure 24:
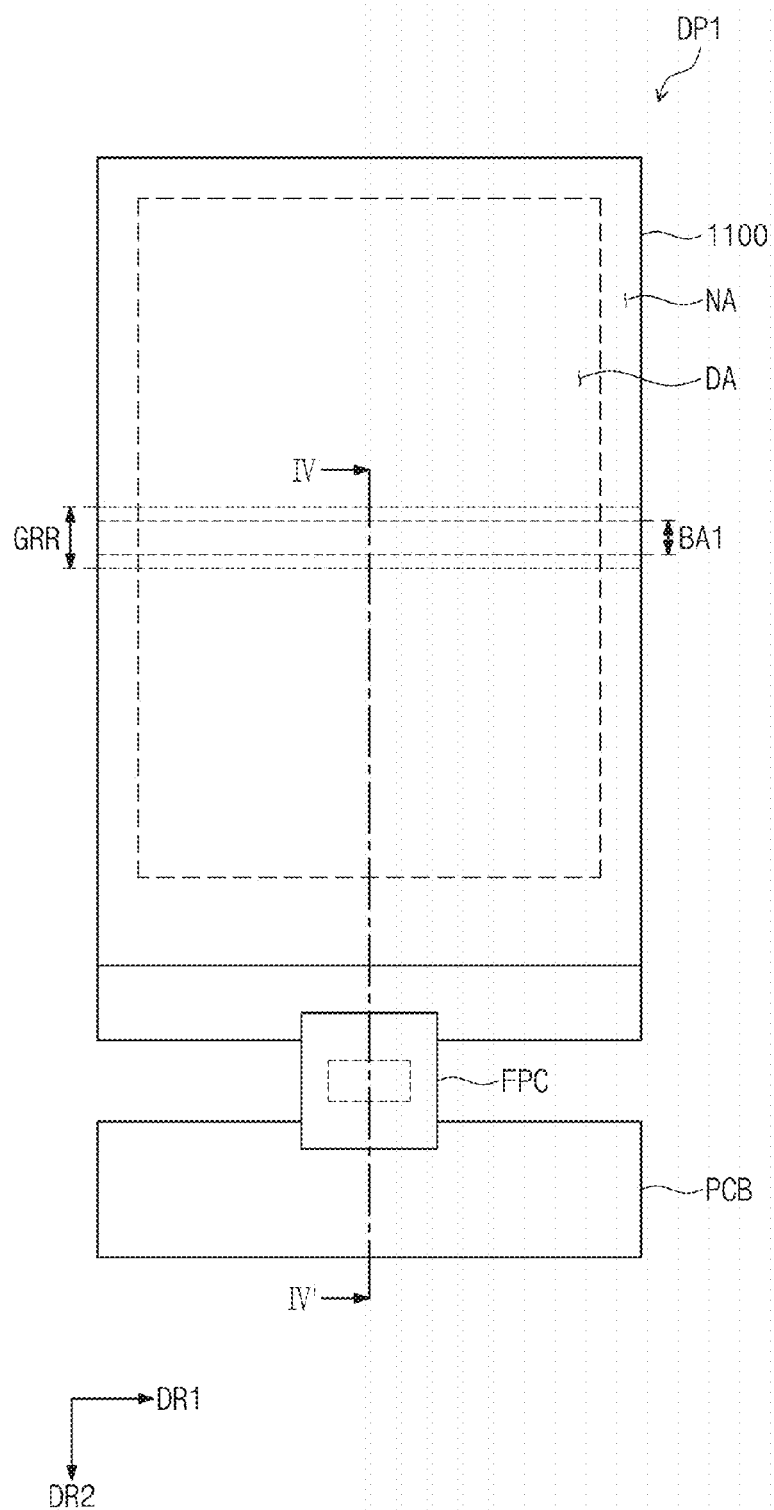
FIG. 24 is a plan view showing the organic light emitting display device of FIG. 23.
Figure 25:
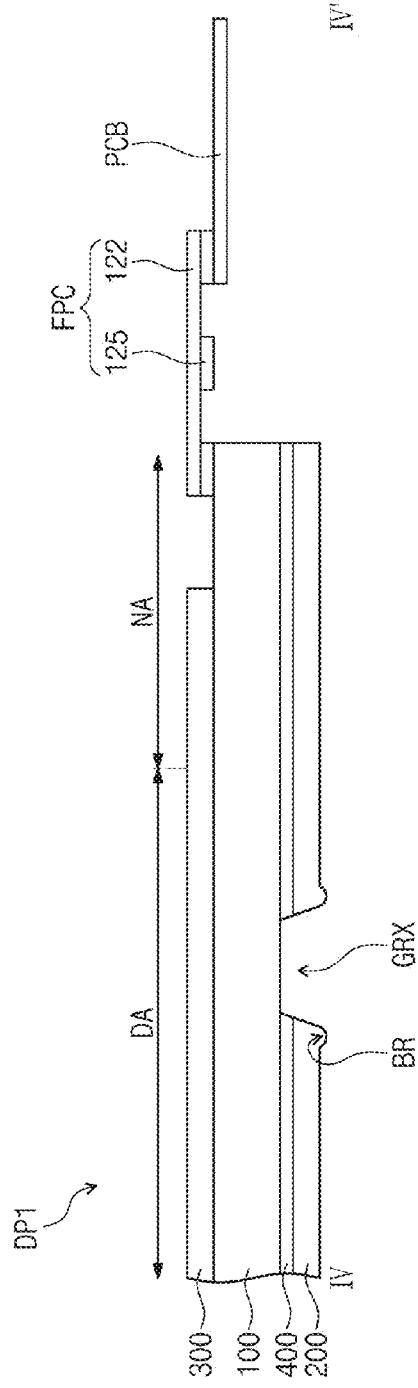
FIG. 25 is a cross-sectional view taken along a line IV-IV' of FIG. 24.
Figure 26:
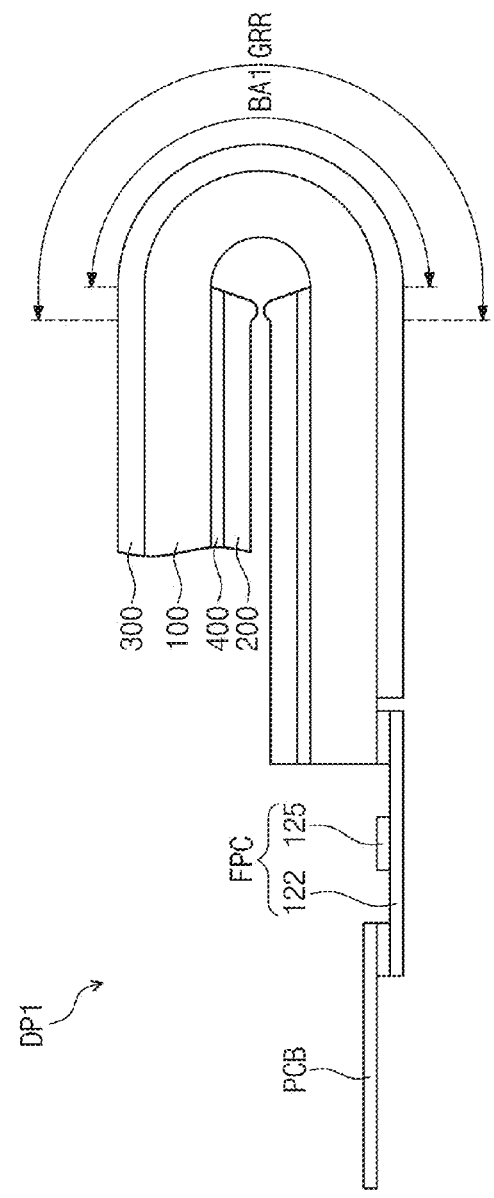
FIG. 26 is a cross-sectional view taken along the line IV-IV' of FIG. 24 when the organic light emitting display device is bent.

FIG. 23 is a perspective view showing an organic light emitting display device according to another exemplary embodiment of the present disclosure; FIG. 24 is a plan view showing the organic light emitting display device of FIG. 23; FIG. 25 is a cross-sectional view taken along a line IV-IV' of FIG. 24; and FIG. 26 is a cross-sectional view taken along the line IV-IV' of FIG. 24 when the organic light emitting display device is bent.

An organic light emitting display device DP1 shown in FIGS. 23 to 26 may have the same structure and function as those of the organic light emitting display device DP described with reference to FIGS. 15 to 18 except for a position of a first area, i.e., a position of a groove.

The organic light emitting display device DP1 may include a display module 1100. The display module 1100 may include a display area DA and a non-display area NA defined therein. The display module 1100 may include a first area GRR defined therein.

The first area GRR may be overlapped with the display area DA. The first area GRR may be defined to cross the display area DA. The adhesive layer 400 (e.g., a pressure-sensitive adhesive layer) and the first film 200, which are overlapped with the first area GRR, may be removed. That is, a groove GRX overlapped with the first area GRR may be provided in the first film 200 and the adhesive layer 400.

The display module 1100 may be bent with respect to a reference axis AX1 extending in the first direction DR1. The reference axis AX1 may be defined under the display module 1100. The display module 1100 may be bent such that two parts of the first film 200, which are divided by the groove GRX, are closer to each other.

The display module 1100 may be bent in the first area GRR. A bending area BA1 may be defined in the display module 1100. The display module 1100 may be flat in an area other than the bending area BA1. The bending area BA1 may have a width smaller than a width of the first area GRR. As described above, since the groove GRX overlapped with the bending area BA1 is provided in the first film 200 and the adhesive layer 400, the display module 1100 may be easily bent in the bending area BA1, and the radius of curvature of the display module 1100 may become small.

Although some exemplary embodiments of the present invention have been described, it is to be understood that the present invention is not limited to these exemplary embodiments, but various changes and modifications can be made by one of ordinary skill in the art within the spirit and scope of the present invention as claimed herein.

What is claimed is:

1. A method of manufacturing a display device, the method comprising:
    forming a display module including a first area defined therein, the display module comprising a display panel including a lower surface and an upper surface opposite the lower surface, a first film under the lower surface of the display panel, a second film on the upper surface of the display panel, and an adhesive layer between the lower surface of the display panel and the first film; and
    irradiating a laser beam in an upper direction extending from the lower surface of the display panel to the upper surface of the display panel to cut the first film to define a film groove therein and the adhesive layer to define an adhesive groove therein to overlap with the film groove along at least one edge of the first area, wherein the laser beam provided to the display panel in the cutting of the first film and the adhesive layer has a laser power equal to or less than about 1 W,
    wherein the display panel comprises a base substrate defining the lower surface, and a first portion of the base substrate exposed by the film groove and the adhesive groove and a second portion of the base substrate overlapped with the first film and the adhesive layer have a difference of crystallization degree equal to or smaller than about 5%.

2. The method of claim 1, wherein the laser beam is a $CO_2$ laser beam or an UV laser beam.

3. The method of claim 2, wherein the $CO_2$ laser beam has a wavelength of from about 9.1 μm to about 10.7 μm, or the UV laser beam has a wavelength equal to or smaller than about 360 nm.

4. The method of claim 1, wherein the first area crosses the display module in a first direction when viewed in a plan view, and the irradiating the laser beam to cut the first film and the adhesive layer comprises:
    irradiating the laser beam to a first edge of the at least one edge of the first area extending in the first direction; and
    irradiating the laser beam to a second edge of the at least one edge of the first area extending in the first direction and spaced apart from the first edge of the first area.

5. The method of claim 4, further comprising bending the display module with respect to a reference axis defined in the first area and extending in the first direction.

6. The method of claim 4, further comprising irradiating another laser beam to the first area between the first edge and the second edge to cut the first film and the adhesive layer.

7. The method of claim 1, wherein a shape of the lower surface of the display panel is not deformed in the irradiating the laser beam to cut the first film and the adhesive layer.

8. The method of claim 1, wherein the base substrate comprises polyimide.

9. The method of claim 1, wherein the first film comprises polyethylene terephthalate.

10. The method of claim 1, wherein a first portion of a lower surface of the base substrate of the display panel is exposed by the irradiating the laser beam to cut the first film and the adhesive layer, and the first portion is flat by the irradiating the laser beam.

11. The method of claim 1, further comprising removing a portion of the first film and a portion of the adhesive layer which are in the first area.

12. A display device comprising:
    a display panel comprising a lower surface and an upper surface opposite the lower surface;
    a first film under the lower surface of the display panel and comprising a film groove defined therein;
    a second film on the upper surface of the display panel; and
    an adhesive layer between the lower surface of the display panel and the first film and comprising an adhesive groove defined therein to overlap with the film groove,
    wherein the display panel comprises a base substrate defining the lower surface,
    wherein the base substrate comprises a first portion and a second portion, the first portion is exposed by the film groove and the adhesive groove, the second portion is overlapped with the first film and the adhesive layer, and the first portion and the second portion have a difference of crystallization degree equal to or smaller than about 5%.

13. The display device of claim 12, wherein the second portion has a crystallization degree greater than a crystallization degree of the first portion.

14. The display device of claim 12, wherein the first portion of the base substrate is connected to an inner surface of the adhesive groove, and the first portion has a crystallization degree smaller by about 5% than a crystallization degree of a third portion exposed by the film groove and the adhesive groove and spaced apart from the second portion by the first portion.

15. The display device of claim 14, wherein the second portion has a same crystallization degree as the third portion.

16. The display device of claim 14, wherein a lower surface of the third portion has a surface roughness greater than a surface roughness of a lower surface of the first portion.

17. The display device of claim 12, wherein an angle between the second portion of the base substrate and an inner surface of the first film providing the film groove is an acute angle, and
wherein an angle between the second portion of the base substrate and an inner surface of the adhesive layer providing the adhesive groove is an acute angle.

18. The display device of claim 12, further comprising a burr on a lower surface of the first film adjacent to the film groove.

19. The display device of claim 12, wherein the display panel comprises a display area to display an image and a non-display area adjacent to the display area, and the film groove and the adhesive groove are in the non-display area.

20. The display device of claim 12, wherein the display panel comprises a display area to display an image and a non-display area adjacent to the display area, and the film groove and the adhesive groove cross the display area when viewed in a plan view.

21. The display device of claim 12, wherein the film groove and the adhesive groove cross the display panel in a first direction, and the display device is bent with respect to a reference axis defined to overlap with the film groove and the adhesive groove and extending in the first direction.

22. The display device of claim 12, wherein the base substrate comprises polyimide.

23. The display device of claim 12, wherein the first film comprises polyethylene terephthalate (PET).

24. The display device of claim 12, wherein the second film comprises a polarizing plate.

25. A display device comprising:
a display panel comprising a first area defined therein and comprising a lower surface and an upper surface opposite the lower surface;
a first film under the lower surface of the display panel;
a second film on the upper surface of the display panel; and
an adhesive layer between the lower surface of the display panel and the first film,
wherein the display panel comprises a base substrate defining the lower surface of the display panel,
wherein the base substrate comprises a first portion and a second portion, a plurality of grooves is defined in the first film and the adhesive layer in the first area to expose the first portion of the base substrate, the second portion of the base substrate is overlapped with the first film and the adhesive layer, the first portion of the base substrate and the second portion of the base substrate have a difference of crystallization degree equal to or smaller than about 5%, and a first portion of the first film and a first portion of the adhesive layer are separated from a second portion of the first film and a second portion of the adhesive layer by a groove of the plurality of grooves in the first area.

26. The display device of claim 25, wherein the base substrate comprises polyimide.

27. The display device of claim 25, wherein the plurality of grooves comprises a first groove extending in a first direction along a first edge of the first area, a second groove extending in the first direction along a second edge of the first area spaced apart from the first edge, and at least one third groove extending in the first direction between the first edge and the second edge.

28. The display device of claim 27, wherein the first area is bent with respect to a reference axis defined in the first area and extending in the first direction.

* * * * *